United States Patent
Eid et al.

(10) Patent No.: US 11,456,721 B2
(45) Date of Patent: Sep. 27, 2022

(54) RF FRONT END MODULE INCLUDING HYBRID FILTER AND ACTIVE CIRCUITS IN A SINGLE PACKAGE

(71) Applicant: Intel Corporation, Santa Clara, CA (US)

(72) Inventors: Feras Eid, Chandler, AZ (US); Telesphor Kamgaing, Chandler, AZ (US); Georgios C. Dogiamis, Chandler, AZ (US); Vijay K. Nair, Mesa, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 16/648,121

(22) PCT Filed: Dec. 28, 2017

(86) PCT No.: PCT/US2017/068750
§ 371 (c)(1),
(2) Date: Mar. 17, 2020

(87) PCT Pub. No.: WO2019/132924
PCT Pub. Date: Jul. 4, 2019

(65) Prior Publication Data
US 2020/0235716 A1 Jul. 23, 2020

(51) Int. Cl.
*H03H 9/10* (2006.01)
*H03H 9/05* (2006.01)
*H03H 9/54* (2006.01)

(52) U.S. Cl.
CPC ........ *H03H 9/1014* (2013.01); *H03H 9/0557* (2013.01); *H03H 9/542* (2013.01)

(58) Field of Classification Search
CPC .... H03H 9/1014; H03H 9/0557; H03H 9/542; H03H 9/545; H03H 2001/0085;
(Continued)

(56) References Cited

U.S. PATENT DOCUMENTS

2003/0227357 A1 12/2003 Metzger et al.
2006/0001123 A1* 1/2006 Heck .................... B81C 1/0023
257/528
(Continued)

OTHER PUBLICATIONS

International Preliminary Report on Patentability for International Patent Application No. PCT/US17/68750, dated Jul. 9, 2020, 9 pgs.
(Continued)

*Primary Examiner* — Rakesh B Patel
*Assistant Examiner* — Jorge L Salazar, Jr.
(74) *Attorney, Agent, or Firm* — Schwabe, Williamson & Wyatt P.C.

(57) ABSTRACT

Packaged RF front end systems including a hybrid filter and an active circuit in a single package are described. In an example, a package includes an active die comprising an acoustic wave resonator. A package substrate is electrically coupled to the active die. A seal frame surrounds the acoustic wave resonator and is attached to the active die and to the package substrate, the seal frame hermetically sealing the acoustic wave resonator in a cavity between the active die and the package substrate.

28 Claims, 17 Drawing Sheets

(58) Field of Classification Search
CPC .... H03H 9/1071; H03H 9/0547; H01L 24/10;
H01L 23/66; H01L 23/10
USPC .............. 333/133, 186, 187, 188, 193–196
See application file for complete search history.

(56) References Cited

U.S. PATENT DOCUMENTS

| | | |
|---|---|---|
| 2006/0202779 A1 | 9/2006 | Fazzio |
| 2006/0267178 A1 | 11/2006 | Metzger |
| 2007/0170565 A1 | 7/2007 | Hong et al. |
| 2009/0108381 A1* | 4/2009 | Buchwalter ......... B81C 1/00246 257/415 |
| 2009/0289722 A1 | 11/2009 | Dropman et al. |
| 2012/0049978 A1 | 3/2012 | Pang |
| 2016/0164488 A1* | 6/2016 | Shin ..................... H03H 9/173 333/187 |
| 2016/0301382 A1 | 10/2016 | Iwamoto |
| 2017/0086320 A1 | 3/2017 | Barber |
| 2017/0250669 A1* | 8/2017 | Kuroyanagi ....... H03H 9/02559 |
| 2018/0337454 A1* | 11/2018 | Han .................... H03H 9/0547 |

OTHER PUBLICATIONS

International Search Report and Written Opinion for International Patent Application No. PCT/US2017/068750 dated Sep. 17, 2018, 12 pgs.
Search Report for European Patent Application No. 17936634.9, dated Jul. 12, 2021, 8 pgs.

\* cited by examiner

RF FRONT END MODULE INCLUDING HYBRID FILTER AND ACTIVE CIRCUITS IN A SINGLE PACKAGE

TECHNICAL FIELD

Embodiments of the present disclosure relate to RF front end systems and modules and more particularly to a packaged RF front end system including a hybrid filter and active circuits.

BACKGROUND

Filters in 5G front end modules account for up to 50% or more of the total real estate of a communications system. Several such filters are dedicated to cellular communication and utilize acoustic wave resonators. The acoustic wave resonators on the other hand need to be hermetically sealed to improve reliability while reducing the impact of environmental conditions on filter performance. There have been proposals to co-integrate the filters along with the active front-end circuits on a same die. This, however, can lead to higher costs as a result of increased silicon die size and low reliability resulting from the attempt to implement a hermetic seal and a resonator on the same active die.

EMBODIMENTS OF THE PRESENT DISCLOSURE

Figure 1:
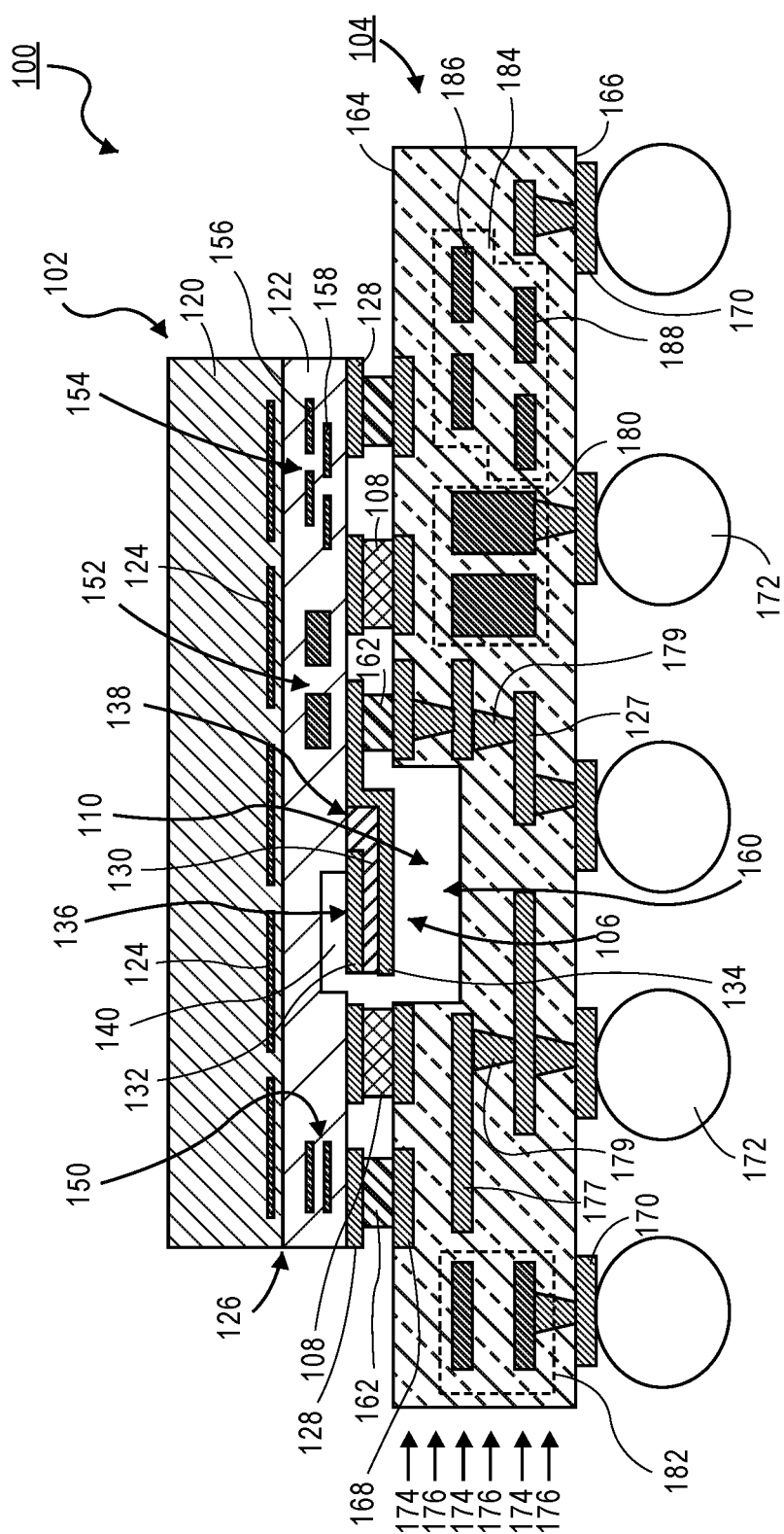
FIG. 1 is an illustration of a cross-sectional view of a packaged system in accordance with an embodiment of the present disclosure.

Packaged RF front end systems including a hybrid filter and an active circuit in a single package are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," "top," "over," and "under" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments of the present disclosure are related to RF systems or modules and more particularly to a fully integrated RF front end system or module which includes a hybrid filter having a hermetically sealed acoustic wave resonator (AWR) and front end active circuitry. In embodiments of the present disclosure, an RF front end system includes front end active circuits, such as amplifiers and switches, passive devices, such as capacitors and inductors, and AWRs, all integrated together in a same package.

In embodiments of the present disclosure, the passive devices and/or acoustic wave resonators may create a hybrid filter, such as a hybrid LC/AWR (lumped components/acoustic wave resonator) filter. In an embodiment, the hybrid filter may contain a transformer. A hybrid filter or bank of filters may have multiple resonators and multiple passive components to provide different frequency band operations as required by, for example, a 5G communication system. In an embodiment, the hybrid filter may be integrated with front end active circuits, such as power amplifiers, low noise amplifiers, matching networks, and switches to create an RF front end system or module fully integrated in a single package. The integrated RF system may enable transmission and/or reception of radio frequency (RF) signals, in a high data rate network, such as a 5G network.

In an embodiment, the front end system includes an active die or main die having one or more resonators. The active die may also contain one or more active circuits, such as amplifiers and switches. In an embodiment, the active die may also include passive devices or components, such as resistors, capacitors, inductors, and transformers formed therein. A package substrate may be electrically coupled to the active die. The package substrate may contain one or more passive components or devices, such as resistors, capacitors, inductors, and transformers embedded therein. A seal ring or frame may be disposed around the resonator and attached to the active die and the package substrate to create a hermetic and/or acoustically sealed cavity around the resonator. The passive devices disposed in the package substrate and/or active die and the resonator may be appropriately coupled together to form a hybrid filter. The hybrid filter may be coupled with RF front end active circuits disposed in the active die to create a front end module fully integrated into a single package.

In another embodiment, a cap or lid may be attached to the active die by a seal frame or ring to create a hermetically and/or acoustically sealed cavity around the resonator. In an embodiment, the cap may be disposed in a cavity or recess formed in the package substrate to enable a short electrical connection to be made between the active die and the package substrate. In an embodiment, one or more electrical connections may be formed through the cap to allow electrical connection to be made from the package substrate to the resonator without having to pass beneath or over the seal frame.

In yet another embodiment, the RF front end system includes a main die or an active die which may include front end active circuits and passive devices, and a resonator die having one or more acoustic wave resonators (resonators) disposed therein. The resonator die may be attached to the active die by a seal frame or ring which surrounds the resonator and creates a hermetic and/or acoustically sealed cavity around the resonator. The active die may be electrically coupled to a package substrate which may have passive devices, such as capacitors, inductors, and transformers embedded therein. The package substrate may have a cavity or recess formed therein and the resonator die may be disposed within the cavity. The resonator die may be electrically coupled to the package substrate by contacts disposed in the cavity.

FIG. 1 is an illustration of a cross-sectional view of a packaged system 100 in accordance with an embodiment of the present disclosure. In embodiments, packaged system 100 is a packaged RF front end module or system comprising an active circuit and a hybrid filter including a resonator. In an embodiment, packaged system 100 includes an active die or main die 102 electrically and physically coupled to a package substrate 104 as illustrated in FIG. 1. Active die 102 includes an acoustic wave resonator (AWR) or resonator 106. A seal frame or ring 108 completely surrounds resonator 106 and is attached to active die 102 and package substrate 104 to form a hermetically and/or acoustically sealed cavity 110 around resonator 106.

In an embodiment, active die 102 includes a semiconductor substrate 120 and an interconnect structure 122. In an embodiment, semiconductor substrate 120 may be a semiconductor substrate, such as but not limited to a silicon substrate, a silicon carbide substrate or a group III-V semiconductor substrate, such as but not limited to gallium nitride (GaN), aluminum nitride (AlN), gallium arsenide (GaAs), and indium phosphide (InP). In an embodiment, substrate 120 is a monocrystalline silicon substrate. In another embodiment, substrate 120 is a gallium nitride substrate.

In an embodiment, semiconductor substrate 120 includes active devices 124, such as but not limited to diodes and/or transistors, disposed in or on a front side 126 of semiconductor substrate 120. Interconnect structure 122 may electrically couple devices, such as transistors, fabricated in or on semiconductor substrate 120 into front end active circuits such as but not limited to power amplifiers, low noise amplifiers, matching networks, and switches. Additionally, in an embodiment, semiconductor substrate 120 may include CMOS transistors interconnected together to form functional circuits such as functional circuits of an applications processor.

Interconnect structure 122 may be disposed on front side 126 of substrate 120. In an embodiment, interconnect structure 122 is a multilayer interconnect structure including multiple metallization layers separated by dielectric layers. Conductive vias may electrically connect one level of metal to another level of metal. Each of the metal layers may contain a plurality of metal interconnects used to route signals and power to various devices on active die 102. The metal layers may be formed from any suitable metal or stack of metals, such as but not limited to copper, aluminum, gold, colbalt, titanium nitride, and tantalum nitride. Dielectric layers may be formed from any suitable dielectric or stack of dielectrics, such as but no limited to polyimide, BCB, silicon oxide, carbon doped silicon oxide, silicon oxynitride, and silicon nitride. It is to be appreciated that interconnect structure 122 may contain many metal layers and dielectric layers, such as between 6-14 metal layers with corresponding dielectric layers, depending upon the complexity and number of elements or devices to be coupled together. Metal layers and conductive vias may be fabricated by any well known processes, such as but not limited to damascene and dual damascene processes.

In an embodiment, resonator 106 may be disposed in interconnect structure 122 as illustrated in FIG. 1. Resonator 106 may be any well known resonator, such as but not limited to a bulk acoustic wave (BAW) resonator, a thin film bulk acoustic wave resonator (TFBAR), a solidly mounted resonator (SMR), a contour-mode resonator (CMR), a composite longitudinal mode resonator (CLMR) or a surface acoustic wave (SAW) device. In an embodiment of the present disclosure, resonator 106 is a thin film bulk resonator having piezoelectric material 130 sandwiched between first electrode 132 and a second electrode 134. The piezoelectric material 130 may be any suitable piezoelectric material, such as but not limited to aluminum nitride, zinc oxide, lead zirconate titanate (PZT), sodium potassium niobate (KNN), and the like. In an embodiment, the piezoelectric material 130 may have a thickness ranging from several micrometers down to a few hundredths of a micrometer. In an embodiment, resonator 106 has a resonance frequency or may resonate at a frequency between 10 MHz to 10 GHz. In an embodiment, the resonator 106 has a cantilever portion 136 and an anchored portion 138. In an embodiment, cantilever portion 136 extends under a cavity 140 disposed in interconnect structure 122 in order to enable the cantilever portion 136 to translate between 0.1-3 microns. In an embodiment, resonator 106 may have an x-y size between 50 micron by 50 microns to 500 microns by 500 microns.

In an embodiment, one or more capacitors 150 may be disposed in interconnect structure 122. Capacitor 150 may be any suitable capacitor, such as but not limited to a parallel plate capacitor, a metal insulator metal (MIM) capacitor, an interdigitated capacitor, a metal finger capacitor, and/or a cup or trench capacitor. Capacitor 150 may include a capacitor dielectric which may be an organic or inorganic material, such as a silica filled epoxy, silicon oxide, silicon nitride, barium titanate, titanium oxide, or lead zirconium titanate. Capacitor 150 may have a form as described in greater detail below in association with FIGS. 16A and 16B. In an embodiment, capacitor 150 is electrically coupled by an electrical connection to resonator 106.

In an embodiment, interconnect structure 122 may include one or more inductors 152 embedded therein as illustrated in FIG. 1. Inductor 152 may be a partial loop inductor, a single loop inductor or a multi-loop inductor fabricated in a single level or multiple levels of interconnect structure 122 and as further described in more detail with respect to FIGS. 17A-17F. In an embodiment, inductor 152 is electrically coupled by an electrical connection to resonator 106. In an embodiment, inductor 152 may consist of one or more turns of conductive material, such as copper, separated by a dielectric such as a polymer, a ceramic, a glass, or air. In one embodiment, the one or more turns of conductive material are separated by the material of interconnect structure 122.

In an embodiment of the present disclosure, interconnect structure 122 includes one or more transformers 154 embedded therein. In an embodiment, transformer 154 includes a first winding 156 and a second winding 158 wherein first winding 156 and second winding 158 are inductively coupled. In an embodiment, first winding 156 is vertically above second winding 158 as illustrated in FIG. 1. In an embodiment, first winding 156 and second winding 158 are substantially aligned with one another. In another embodiment, first winding 156 is slightly offset from a central axis of second winding 158 in order to reduce the coupling coefficient of transformer 154. In an embodiment, first winding 156 is a planar winding fabricated in a single metal layer of interconnect structure 122 and second winding 158 is a planar winding fabricated in a single different metal layer of interconnect structure 122. In an embodiment, first winding 156 and second winding 158 may each be fabricated in multiple layers of interconnect structure 122 in order to create high quality factor (high Q) inductors for transformer 154. In an embodiment, first winding 156 may be electrically coupled to a capacitor 150 embedded within interconnect structure 122. In another embodiment, second winding 158 may be electrically coupled to another capacitor 150 embedded in interconnect structure 122.

In an embodiment, active die 102 is directly and physically attached to package substrate 104 by a seal frame or ring 108. Seal frame 108 completely surrounds resonator 106 and creates a hermetic seal between interconnect structure 122 of active die 102 and package substrate 104. Seal frame 108, interconnect structure 122, and package substrate 104 form a hermetic and acoustically sealed air cavity 110 around resonator 106 which protects resonator 106 from environmental conditions and interference. Seal frame 108 may be made from a metal, such as but not limited to gold, copper, tin and indium. In other embodiments, seal frame 108 may be made from an insulating material, such as but not limited to a glass frit, a polymer such as a liquid crystal polymer, and an inorganic dielectric. In an embodiment, seal frame 108 includes a metal ring or frame disposed on the outer surface of interconnect structure 122 and a metal ring or frame on an outer surface of package substrate 104. The metal rings or frames may be directly bonded together by, for example diffusion bonding or may be bonded together by an intermediate solder, such as an eutectic solder, (e.g., gold tin). In an embodiment, a cavity 160 is formed in package substrate 104 beneath resonator 106 to allow resonator 106 to freely translate between at least 0.1-3 microns. Including cavity 160 in package substrate 104 enables a thinner seal ring 108 to be utilized which enables active die 102 and package substrate 104 to be electrically coupled together by shorter contacts 162 and thereby improves performance. In an embodiment, seal frame 108 may have a thickness of less than 5 microns and in other embodiments less than 3 microns. In an embodiment of the present disclosure, the seal frame may have a thickness between 0.5-10 microns.

Although only a single resonator 106 is illustrated in FIG. 1, it is to be appreciated that active die 102 may contain two or more resonators 106. In one embodiment, two or more resonators 106 may be located in the cavity 110 created by active die 102, seal frame 108, and package substrate 104. In another embodiment, active die 102 may contain two or more resonators 106 and two or more seal frames 108 so that one resonator 106 may be located in one cavity, and a second resonator 106 may be located in a second different cavity.

Active die 102 may contain a plurality of contact pads or bond pads 128 disposed on an outer surface of interconnect structure 122. Bond pads 128 may be electrically coupled to various active devices and circuits, and to passive devices disposed on or in active die 102. Active die 102 may be electrically coupled to package substrate 104 by a plurality of electrical contacts 162, such as but not limited to flip chip contacts, solder balls, and solder bumps.

In an embodiment, packaged system 100 includes one or more contacts 162 disposed within the perimeter of seal frame 108 as illustrated in FIG. 1. In an embodiment, packaged system 100 includes at least two electrical contacts 162 located within the perimeter of seal frame 108 so that an electrical contact may be provided within cavity 110 to each of the electrodes 132 and 134 of resonator 106. In an embodiment, package substrate 104 has a die side 164 and a land side or second level interconnect (SLI) 166. A plurality of contact pads 168 are disposed on die side 164. In an embodiment, solder balls or bumps 162 electrically couple contact pads 128 on active die 122 to corresponding contact pads 168 on package substrate 104 as illustrated in FIG. 1. Land side 166 of package substrate 104 includes a plurality of contact pads or land pads 170. A plurality of second level contacts 172, such as solder balls or bumps may be disposed on pads 170 to enable packaged system 100 to be electrically coupled to other components, such as a mother board or main board.

Package substrate 104 may be any suitable package substrate. In an embodiment, package substrate 104 is an organic multilayer printed circuit board including silica-filled epoxy, FR4, or polyimide. In another embodiment, package substrate 104 is an inorganic package substrate such as a ceramic substrate, such as a low temperature co-fired ceramic substrate or a high temperature co-fired ceramic substrate, a glass substrate (e.g., silicon oxide), or a semiconductor substrate (e.g., silicon). In an embodiment, package substrate 104 is a multilayer package substrate which includes a plurality of metallization layers 174 each comprising electrical traces 177 or power planes. Each metallization layer 174 may be separated from adjacent metal layers 174 by one or more dielectric layers 176. Conductive vias 179 may be disposed in the dielectric layers 176 to enable electrical connections from one metallization layer to another. In an embodiment, when vias 179 are formed by, for example, laser drilling via openings, the vias may have a conical shape as illustrated in FIG. 1.

In an embodiment, package substrate 104 includes one or more inductors 180 embedded therein as illustrated in FIG. 1. Inductor 180 may be a partial loop inductor, a single loop inductor or a multi-loop inductor fabricated in a single level or multiple levels of package substrate 104 as described in more detail with respect to FIGS. 17A-17F. In an embodiment, inductor 180 may be electrically coupled by an electrical connection to resonator 106. In an embodiment, inductor 180 may consist of one or more turns of conductive material, such as copper, separated by a dielectric such as a polymer, a ceramic, a glass, or air. In one embodiment, the one or more turns of conductive material are separated by the material of package substrate 104. In an embodiment of the present disclosure, inductor 180 may be part of a network of inductors including a transformer equivalent circuit, such as a Pi-network or a T-network.

In an embodiment, package substrate 104 may include one or more capacitors 182 embedded therein. Capacitor 182 may be a parallel plate capacitor or an interdigitated capacitor and may be fabricated in single metal layer 174 or multiple metal layers 174 of package substrate 104 as described in more detail with respect to FIGS. 16A and 16B. In an embodiment, capacitor 182 may be electrically coupled to resonator 106 of active die 102. In an embodiment, capacitor 182 may be electrically coupled by an electrical connection to inductor 180.

In an embodiment of the present disclosure, package substrate 104 includes one or more transformers 184 embedded therein. In an embodiment, transformer 184 has a first winding 186 and a second winding 188 wherein the first winding 186 and the second winding 188 are inductively coupled. In an embodiment, first winding 186 is vertically above second winding 188 as illustrated in FIG. 1. In an embodiment, first winding 186 and second winding 188 are substantially aligned with one another. In another embodiment, first winding 186 has a central axis which is slightly offset from a central axis of second winding 188 in order to reduce a coupling coefficient of transformer 184. In an embodiment, first winding 186 is a planar winding fabricated in a single metal layer 174 of package substrate 104 and second winding 188 is a planar winding fabricated in a different metal layer 174 of package substrate 104. In an embodiment, first winding 186 is separated from second winding 188 by a vertical distance of between 15 microns and 60 microns. In an embodiment, first winding 186 and second winding 188 may each be fabricated in multiple layers 174 of package substrate 104 in order to create high quality factor (high Q) inductors for transformer 184. In an embodiment, first winding 186 may be electrically coupled to a capacitor 182 embedded within package substrate 104. In an embodiment, second winding 188 may be electrically coupled to another capacitor 182 embedded in package substrate 104. In an embodiment, transformer 184 may be a vertical transformer where first winding 186 and second winding 188 are fabricated in multiple layers 174 of package substrate 104. In an embodiment, first winding 186 and second winding 188 may be interleaved with one another. In an embodiment, the vertical transformer has an implementation where the vertical axes of the first winding 186 and second winding 188 are not aligned and are offset to provide a mutual coupling adjustment. In an embodiment, package substrate 104 includes one or more discrete inductors and/or one or more discrete capacitors attached to die side 164 of package substrate 104 (not shown). In an embodiment, one or more antennas may be embedded within package substrate 104 (not shown).

In an embodiment, package substrate 104 is a glass based substrate (e.g., regular glass, such as silicon oxide or silicon dioxide or a photo sensitive glass), or a ceramic based substrate (e.g., alumina or low temperature co-fired ceramic (LTCC)) because these materials along with metal features contained therein are hermetic and may not require an additional coating of the cavity 110 with a hermetic material around the resonator 106 in order to hermetically seal the resonator 106.

Figure 2:
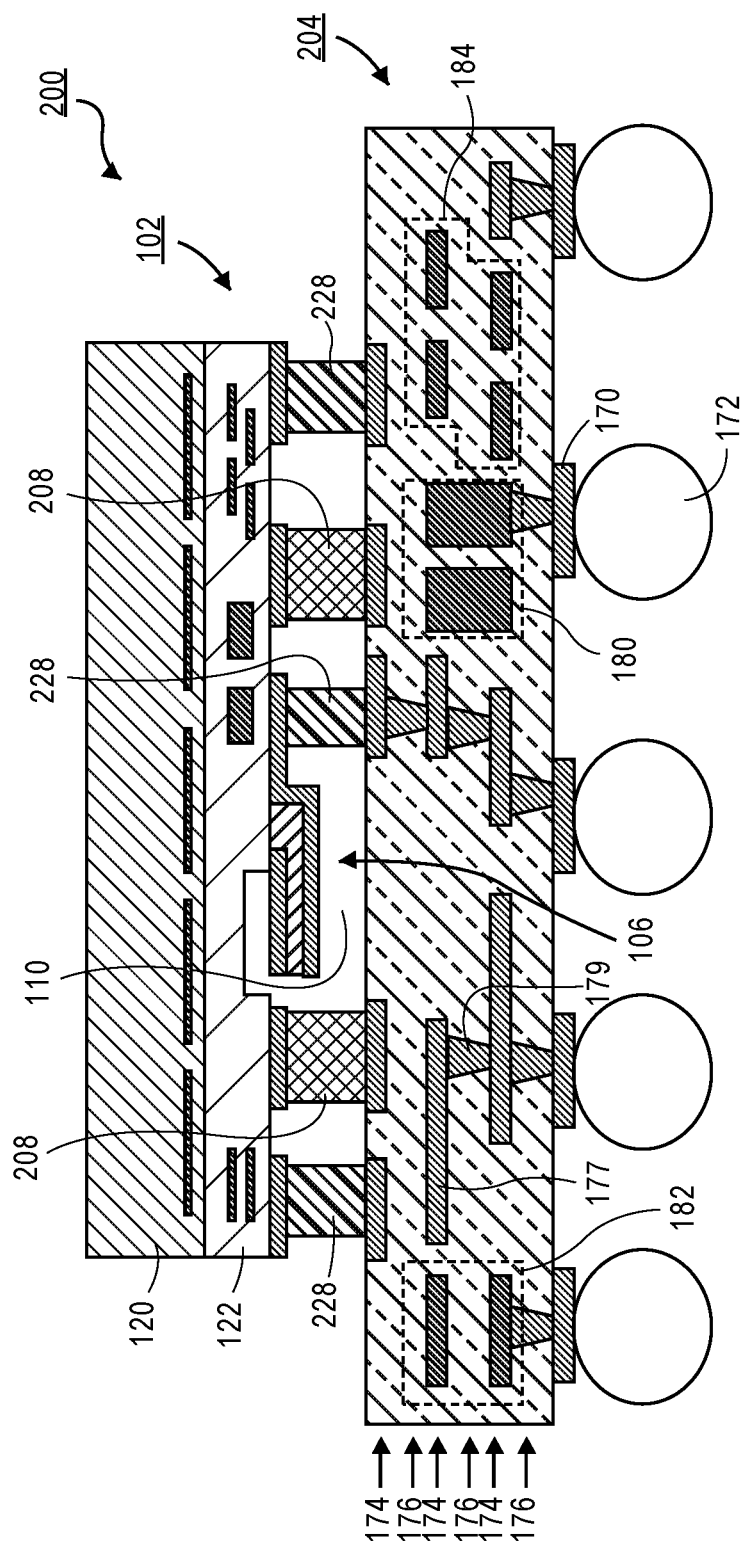
FIG. 2 is an illustration of a cross-sectional view of a packaged system in accordance with an embodiment of the present disclosure.

FIG. 2 is an illustration of a cross-sectional view of a packaged system 200 in accordance with an embodiment of the present disclosure. Packaged system 200 is similar to packaged system 100, however, packaged system 200 includes a package substrate 204. Package substrate 204 is similar to package substrate 104 but does not include a cavity 160 disposed therein beneath resonator 106 as illustrated in FIG. 2. By not including a cavity in package substrate 204 beneath resonator 106, the cost and difficulty of manufacturing package substrate 204 may be reduced relative to package substrate 104. In an embodiment, active die 102 may be attached to package substrate 204 by a seal frame 208 which may be similar to seal frame or ring 108 but which may be substantially thicker than seal frame or ring 108 in order to provide sufficient space for resonator 106 to translate. In an embodiment, seal frame 208 may have a thickness greater than 5 microns and in other embodiments may have a thickness greater than 10 microns. Because seal frame 208 is thicker and spaces active die 102 a greater distance from package substrate 204, electrical contacts 228 may also need to be made thicker as illustrated in FIG. 2. In an embodiment, substrate 204 is glass based or ceramic based substrate so that a hermetic coating may not be necessarily needed to be disposed on the outer surface of package substrate 204 in cavity 110 to hermetically seal resonator 106.

Figure 3:
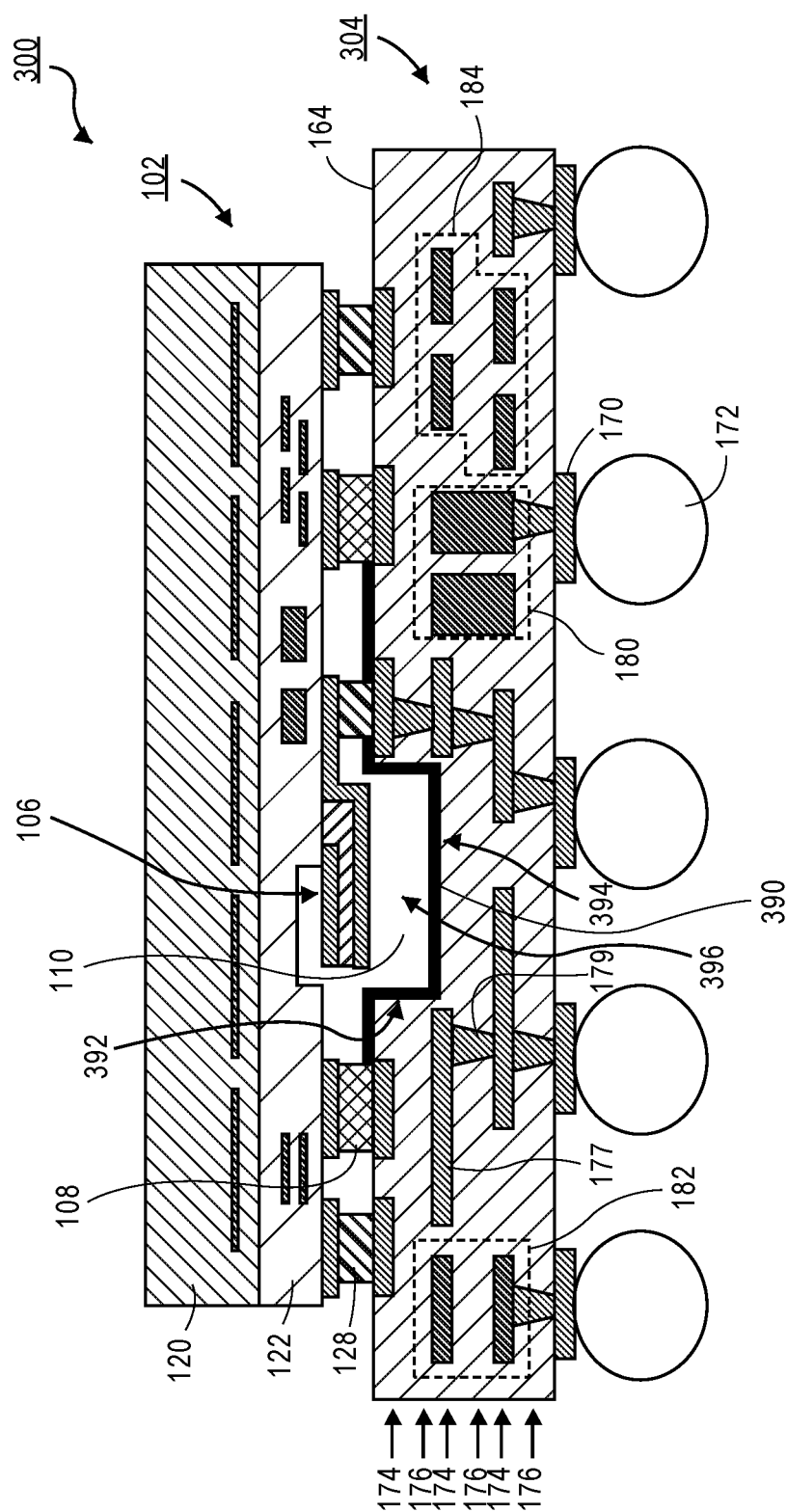
FIG. 3 is an illustration of a cross-sectional view of a packaged system in accordance with an embodiment of the present disclosure.

FIG. 3 is an illustration of a cross-sectional view of a packaged system 300 in accordance with an embodiment of the present disclosure. Packaged system 300 is similar to packaged system 100 except that packaged system 300 includes a package substrate 304. Package substrate 304 is similar to package substrate 104 except that it includes a hermetic coating 390. In an embodiment, hermetic coating 390 is disposed on die side 164 of package substrate 304 in cavity 110 to provide a hermetic seal of package substrate 304 in cavity 110. The use of a hermetic coating 390 is especially useful when package substrate 304 is an organic substrate or includes organic materials. It is to be appreciated that organic materials, such as epoxy build up films, solder resist, and FR4 typically used in organic substrates are not hermetic. Therefore, it may be desirable to coat any organic material in the resonator cavity 110 with a hermetic layer 390 to provide a fully sealed cavity 110. In an embodiment, hermetic coating 390 is disposed on die side of package substrate 304, along sidewall 392 and a bottom surface 394 of a cavity 396 formed in package substrate 304 as illustrated in FIG. 3. Hermetic coating 390 may be formed from any suitable hermetic material, such as a metal such as copper, or a hermetic inorganic dielectric, such as but not limited to silicon oxide and silicon nitride. An inorganic dielectric may be suitable in areas where electrical shorting of features is to be avoided. A metal hermetic coating 390 may be formed by, for example, plating or physical vapor deposition (e.g., sputtering). A hermetic inorganic dielectric may be formed by physical vapor deposition or chemical vapor deposition. A blanket deposited hermetic coating may be patterned by, for example, masking and etching.

Figure 4:
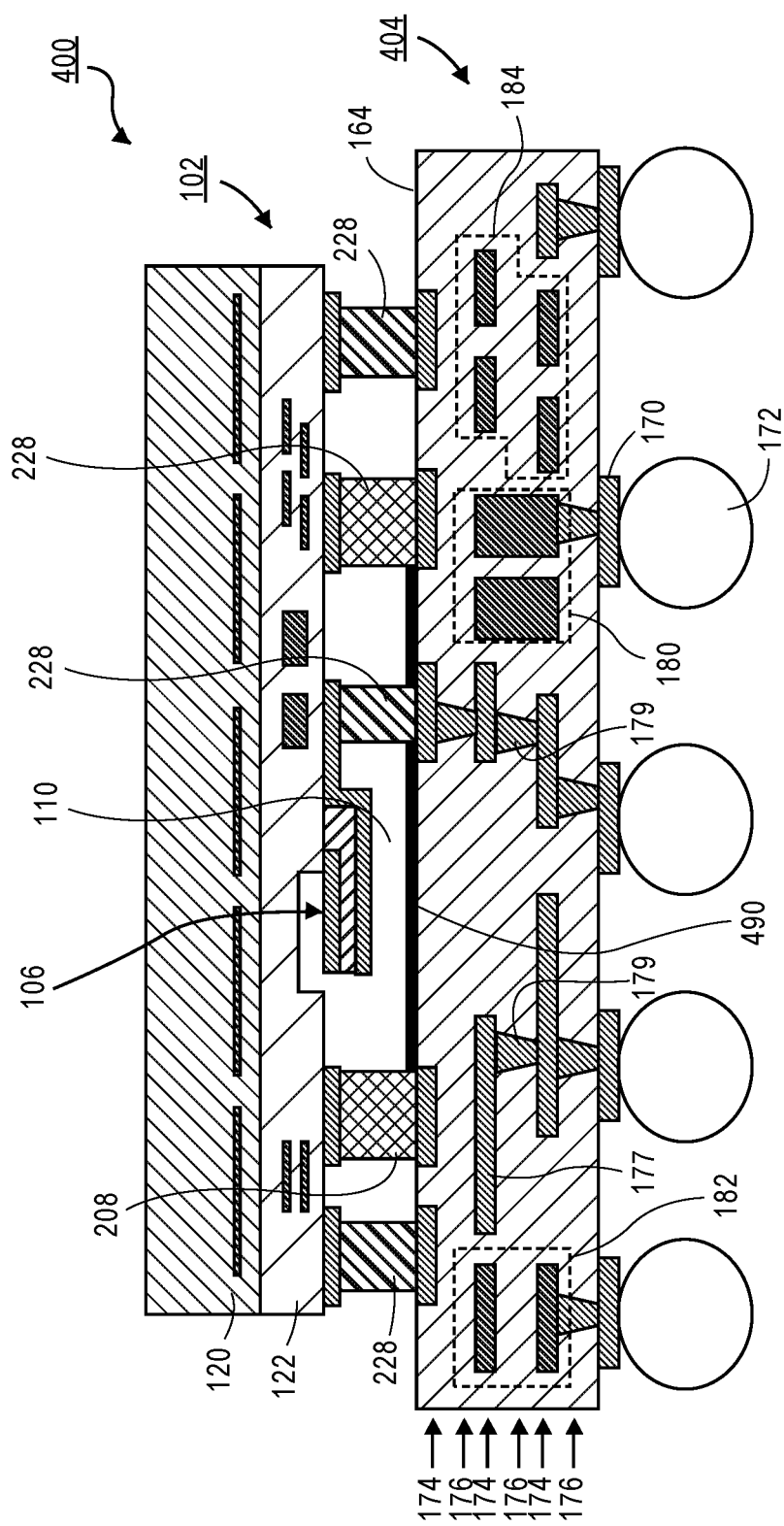
FIG. 4 is an illustration of a cross-sectional view of a packaged system in accordance with an embodiment of the present disclosure.

FIG. 4 is an illustration of a cross-sectional view of a packaged system 400 in accordance with an embodiment of the present disclosure. Packaged system 400 is similar to packaged system 200 except that packaged system 400 includes a package substrate 404. Package substrate 404 includes a hermetic layer 490 deposited on an outer planar surface of die side 164 of package substrate 404 as illustrated in FIG. 4. Hermetic coating 490 is disposed on the outer surface of package substrate 404 in cavity 110.

Figure 5:
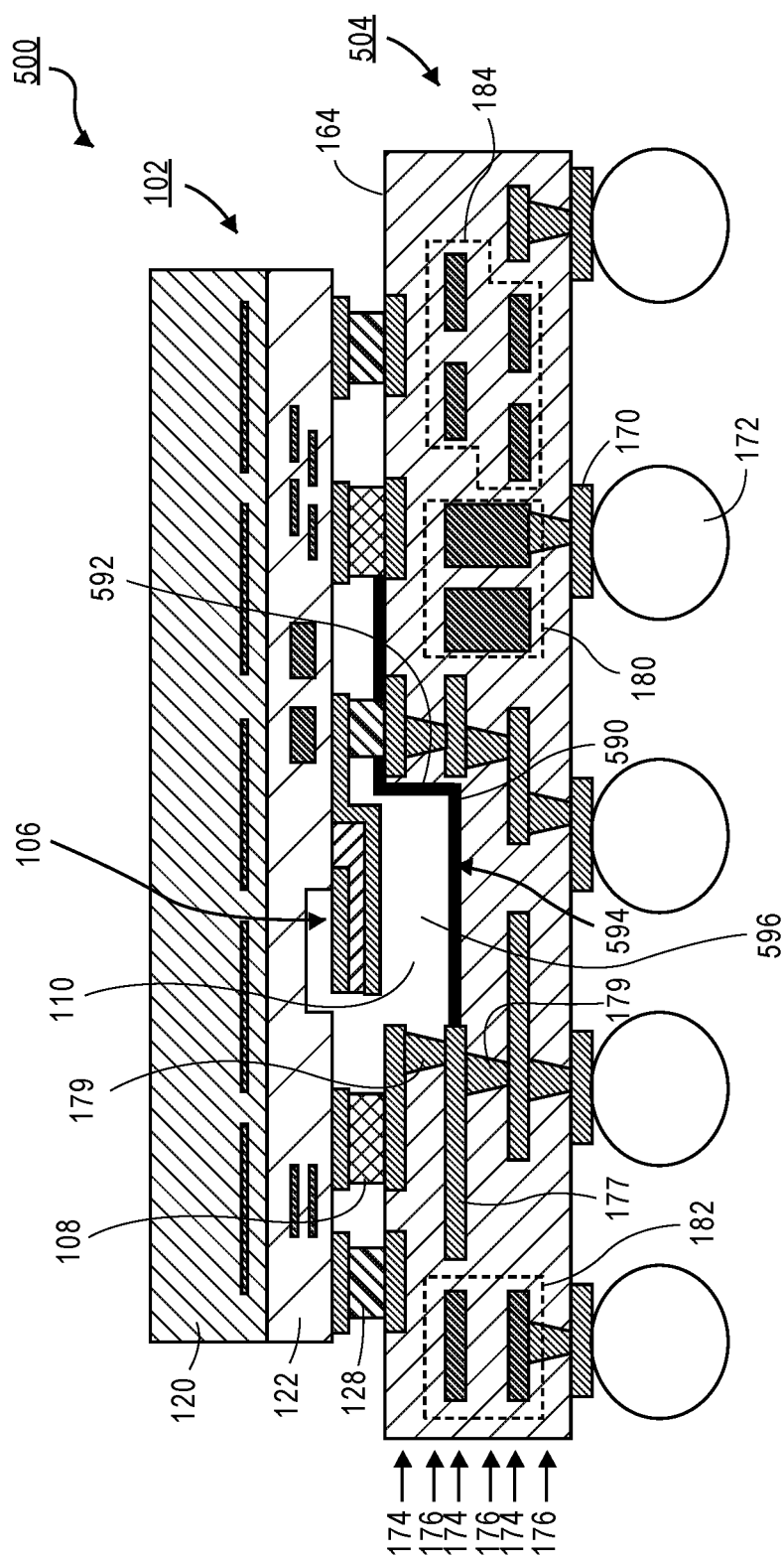
FIG. 5 is an illustration of a cross-sectional view of a packaged system in accordance with an embodiment of the present disclosure.

FIG. 5 is an illustration of a cross-sectional view of a packaged system 500 in accordance with an embodiment of the present disclosure. Packaged system 500 is similar to packaged system 100 except that packaged system 500 includes a package substrate 504. Package substrate 504 is similar to package substrate 104 except that package substrate 504 includes a hermetic barrier created in part by a hermetic coating 590 and in part by metal layers and vias of package substrate 504. For example, in an embodiment, a hermetic barrier may be created by depositing a hermetic insulating layer 590, such as an inorganic dielectric, such as silicon oxide or silicon nitride, along outer surfaces of package substrate 504 within cavity 596 including along a sidewall 592 and a bottom surface 594 of cavity 596 formed in package substrate 504 as illustrated in FIG. 5. Additionally, the hermetic barrier may contain one or more vias 179 of package substrate 504 to seal a sidewall of the cavity 596. Additionally, the hermetic barrier may include one or more metal traces or bond pads of a metal layer 174 of package substrate 504 as illustrated in FIG. 5.

Figure 6:
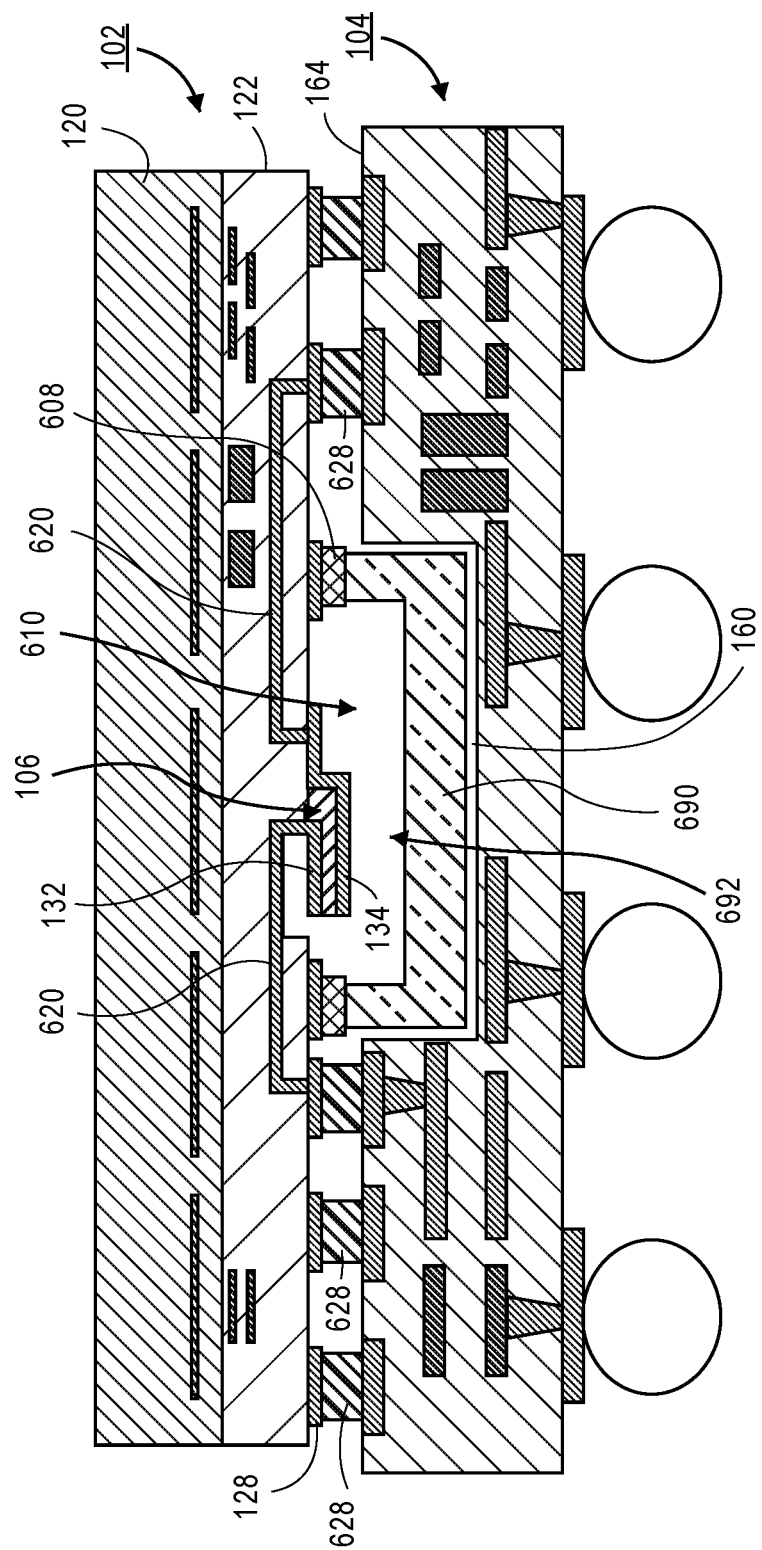
FIG. 6 is a cross-sectional illustration of a packaged system in accordance with an embodiment of the present disclosure.

FIG. 6 is a cross-sectional illustration of a packaged system 600 in accordance with an embodiment of the present disclosure. Packaged system 600 is similar to packaged system 100. Packaged system 600 further includes a cap or lid 690. In an embodiment, a seal frame or ring 608 completely surrounds resonator 106 and directly and physically attaches cap 690 to active die 102. Seal frame or ring 608 completely surrounds resonator 106 and creates a hermetic seal between interconnect structure 122 of active die 102 and cap 690. Seal frame 608, interconnect structure 122, and cap 690 form a hermetic and acoustically sealed air cavity 610 around resonator 106 which protects resonator 106 from environmental conditions and/or interference. Seal frame or ring 608 may be fabricated with any materials and processes as described with respect to seal frame or ring 108.

In an embodiment, cap 690 is formed from a semiconductor, such as silicon, a ceramic, such as alumina or low temperature co-fired ceramic (LTCC), a metal, or other hermetic materials. In an embodiment, cap 690 may include a cavity 692 disposed in a surface nearest resonator 106 to provide sufficient space to enable resonator 106 to translate between 0.1-3 microns in cavity 610. In an embodiment, cavity 692 may be formed in cap 690 by a machining or etching.

In an embodiment, cap 690 may be located within cavity 160 formed in package substrate 104 as illustrated in FIG. 6. In an embodiment, cavity 160 has a sufficient volume to allow cap 690 to be easily inserted therein when bonding active die 102 to package substrate 104. In an embodiment, cap 690 may slightly protrude out from cavity or recess 160 as illustrated in FIG. 6. In another embodiment, cap 690 has a top surface which is substantially coplanar with a top surface of die side 164 of package substrate 104.

In an embodiment, cavity 160 has a sufficient depth to accommodate the height of cap 690. In an embodiment, cap 690 serves only to hermetically seal resonator 106 and provides no electrical routing. As such, electrical connection 620 to electrodes 132 and 134 of resonator 106 are routed in interconnect structure 122 to electrically isolate them from seal frame 608 as illustrated in FIG. 6. In an embodiment, contacts 628 which provide electrical coupling between package substrate 104 and electrodes 132 and 134 of resonator 106 are located outside the perimeter of seal frame or ring 608 and outside of cavity 610 as illustrated in FIG. 6.

Figure 7:
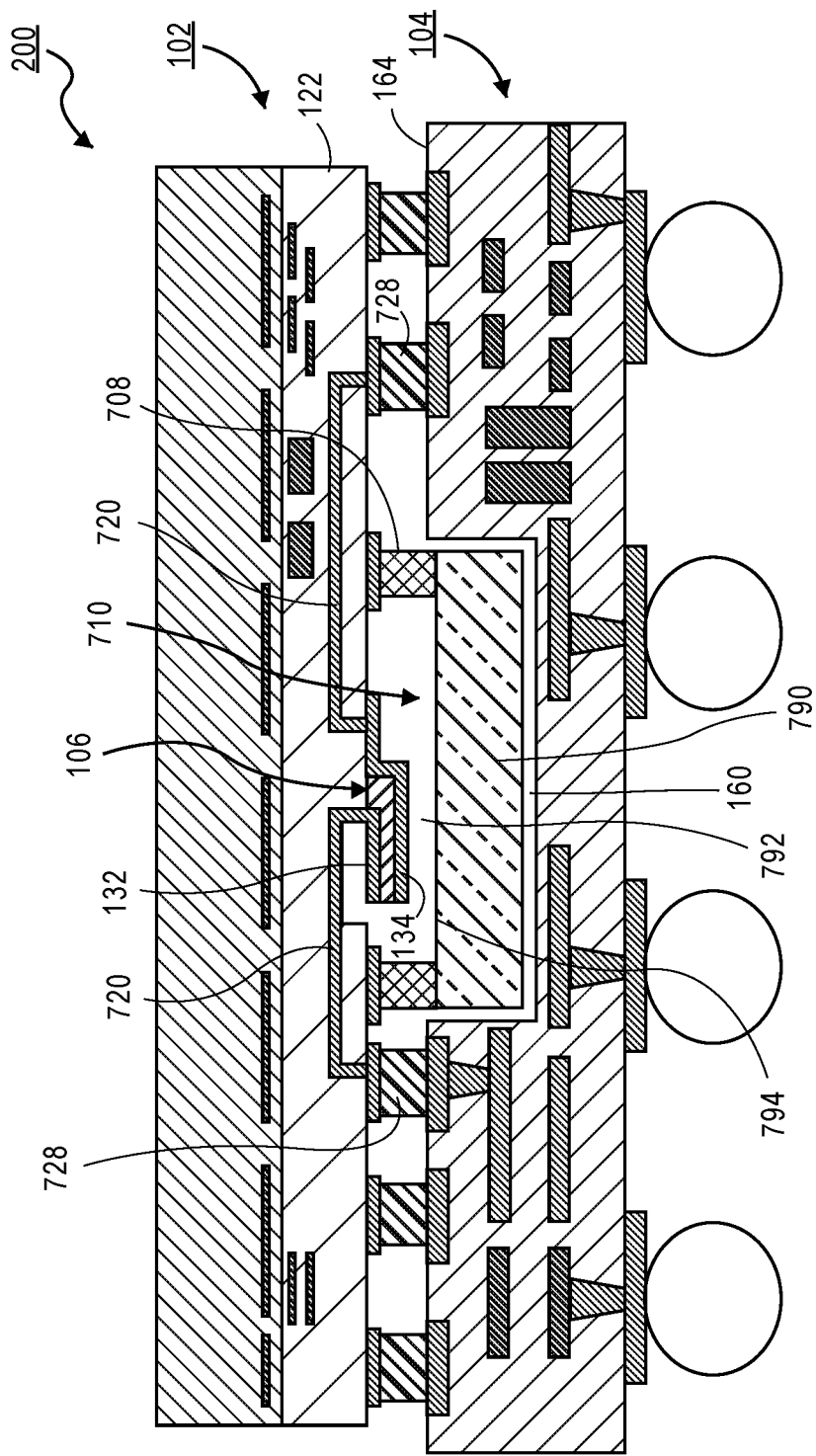
FIG. 7 is a cross-section illustration of a packaged system in accordance with an embodiment of the present disclosure.

FIG. 7 is a cross-section illustration of a packaged system 700 in accordance with an embodiment of the present disclosure. Packaged system 700 includes an active die, such as active die 102, coupled to a package substrate 104 as illustrated in FIG. 7. Packaged system 700 includes a cap or lid 790. In an embodiment, cap 790 is attached to active die 102 by a seal frame or ring 708. Seal frame or ring 708 completely surrounds resonator 106 and directly and physically attaches cap 790 to active die 102. Seal frame 708 completely surrounds resonator 106 and creates a hermetic seal between interconnect structure 122 of active die 102 and cap 790. Seal frame 708, interconnect structure 122 and cap 790 form a hermetic and acoustically sealed air cavity 710 around resonator 106 which protects resonator 106 from environmental conditions and interference. Seal frame 708 may be made with any materials and processes as described with respect to seal frame 108. In an embodiment, cap 790 is formed from a semiconductor, such as silicon, a ceramic, a glass or an epoxy. In an embodiment, cap 790 has a surface 794 nearest active die 102 which is planar as illustrated in FIG. 7. In an embodiment, cap 790 has a planar surface 794 which extends beneath resonator 106 and is attached to seal frame 708, as illustrated in FIG. 7. It is to be appreciated that a planar cap 790 may be easier or less expensive to manufacture than a cap with a recess or cavity. In an embodiment, seal frame 708 has a thickness sufficient to space planar surface 794 of cap 790 sufficiently away from resonator 106 to allow resonator 106 to translate between 0.1-3 microns. In an embodiment, seal frame 708 has a thickness greater than 5 microns and in other embodiments greater than 10 microns. In an embodiment, planar surface 794 of cap 790 is below die side surface 164 of substrate 104. In an embodiment, cap 790 serves only to hermetically seal resonator 106 and provides no electrical routing. As such, electrical connections 720 to electrodes 132 and 134 of resonator 106 are disposed in interconnect structure 122 to electrically isolate them from seal frame 708. In an embodiment, contacts 728 which provide electrical coupling between package substrate 104 and electrodes 132 and 134 of resonator 106 are located outside of the perimeter of seal frame 708 and outside of cavity 710 as illustrated in FIG. 7.

Figure 8:
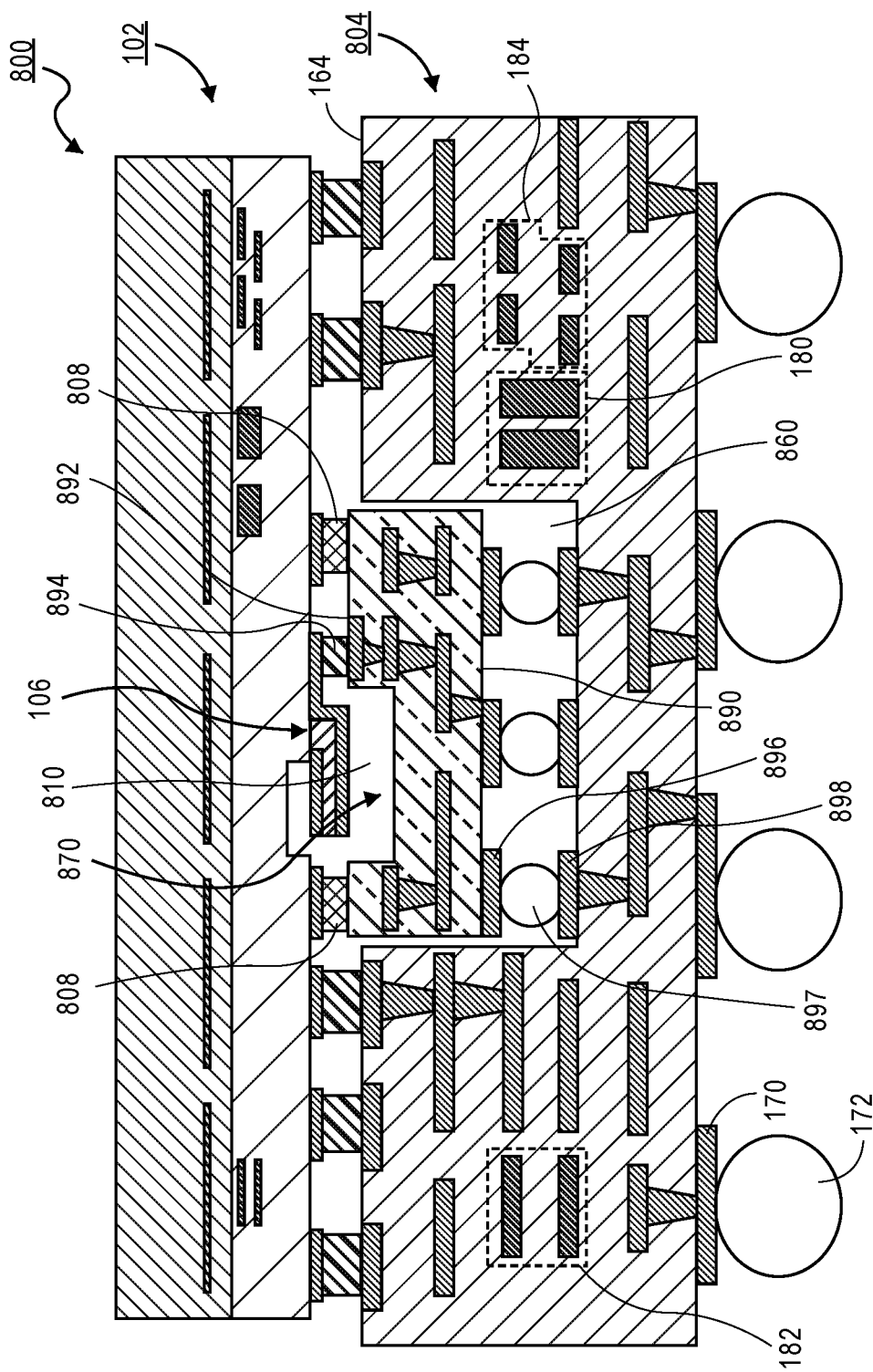
FIG. 8 is a cross-sectional illustration of a packaged system in accordance with an embodiment of the present disclosure.

FIG. 8 is a cross-sectional illustration of a packaged system 800 in accordance with an embodiment of the present disclosure. Packaged system 800 includes an active die, such as active die 102, electrically coupled to package substrate 804. Package substrate 804 may be similar to package substrate 104 in most respects such as indicated by like reference numerals. Packaged system 800 includes a cap or lid 890. Cap or lid 890 provides electrical connections and routing between resonator 106 on active die 102 and package substrate 804. In an embodiment, cap 890 includes interconnects in the form of metal vias and/or traces separated from each other by dielectric and/or high resistivity semiconductor material. For example, in an embodiment, cap 890 may include a multilayer interconnect structure including multiple metallization layers separated by dielectric layers. Conductive vias may electrically connect one level of metal to another level of metal. Each of the metal layers may contain a plurality of metal interconnects used to route signals and power within cap 890. The metal layers may be formed from any suitable metals or stack of metals, such as but not limited to copper, gold, aluminum, cobalt, and titanium. Dielectric layers may be formed any suitable dielectric or stack of dielectrics, such as but not limited to silicon oxide, carbon doped silicon oxide, silicon oxynitride, and silicon nitride. Cap 890 has one or more top side or die side contact pads 892 which enable direct electrical coupling of cap 890 to active die 102 by, for example, solder balls or bumps 894. In an embodiment, cap 890 has at least two contact pads 892 and two solder balls or bumps 894 to enable electrical connection of cap 890 to electrodes 132 and 134 of resonator 106.

In an embodiment, cap 890 includes a plurality of bottom contact pads 896 which may be electrically coupled by electrical contacts 897, such as solder balls or solder bumps to contact pads 898 disposed in a cavity or recess 860 of package substrate 804 as illustrated in FIG. 8. In an embodiment, cap 890 is located in cavity or recess 860 formed in a die side 164 of package substrate 804 as illustrated in FIG. 8. In an embodiment, a seal frame or ring 808 completely surrounds resonator 106 and directly and physically attaches cap 890 to active die 102. Seal frame 808 completely surrounds resonator 106 and creates a hermetic seal between interconnect structure 122 of active die 102 and cap 890. Seal frame 808, interconnect structure 122 and package substrate 804 form a hermetic and acoustically sealed air cavity 810 around resonator 106 which protects resonator 106 from environmental conditions and interference. Seal frame 808 may be formed from any material and process such as described with respect to seal frame 108. In an embodiment, contacts 894 coupling cap 890 to active die 102 and in particularly to resonator 106 are located inside the perimeter of seal frame 808 and cavity 810. In this way, routing to resonator 106 over or beneath seal frame 808 may be eliminated. In an embodiment, cap 890 includes a cavity 870 located beneath resonator 106. Cavity 870 may enable resonator 106 to freely translate between 0.1-3 microns.

In an embodiment, cap 890 may include passive devices, such as resistors, capacitors, inductors and transformers embedded therein. In an embodiment, one or more inductors are embedded within cap 890. Inductors may be partial loop inductors, single loop inductors, or multi loop inductors fabricated in a single level or multiple levels of cap 890 and as described in more detail with respect to FIGS. 17A-17F. In an embodiment, inductors formed within cap 890 may be electrically coupled by an electrical connection to resonator 106. In an embodiment, cap 890 may include one or more capacitors embedded therein. The capacitors may be parallel plate capacitors or interdigitated capacitors and may be fabricated in a single metal layer or multiple metal layers of cap 890 as described in more detail with respect to FIGS. 16A-16B. In an embodiment, a capacitor embedded within cap 890 may be electrically coupled to resonator 106.

Figure 9:
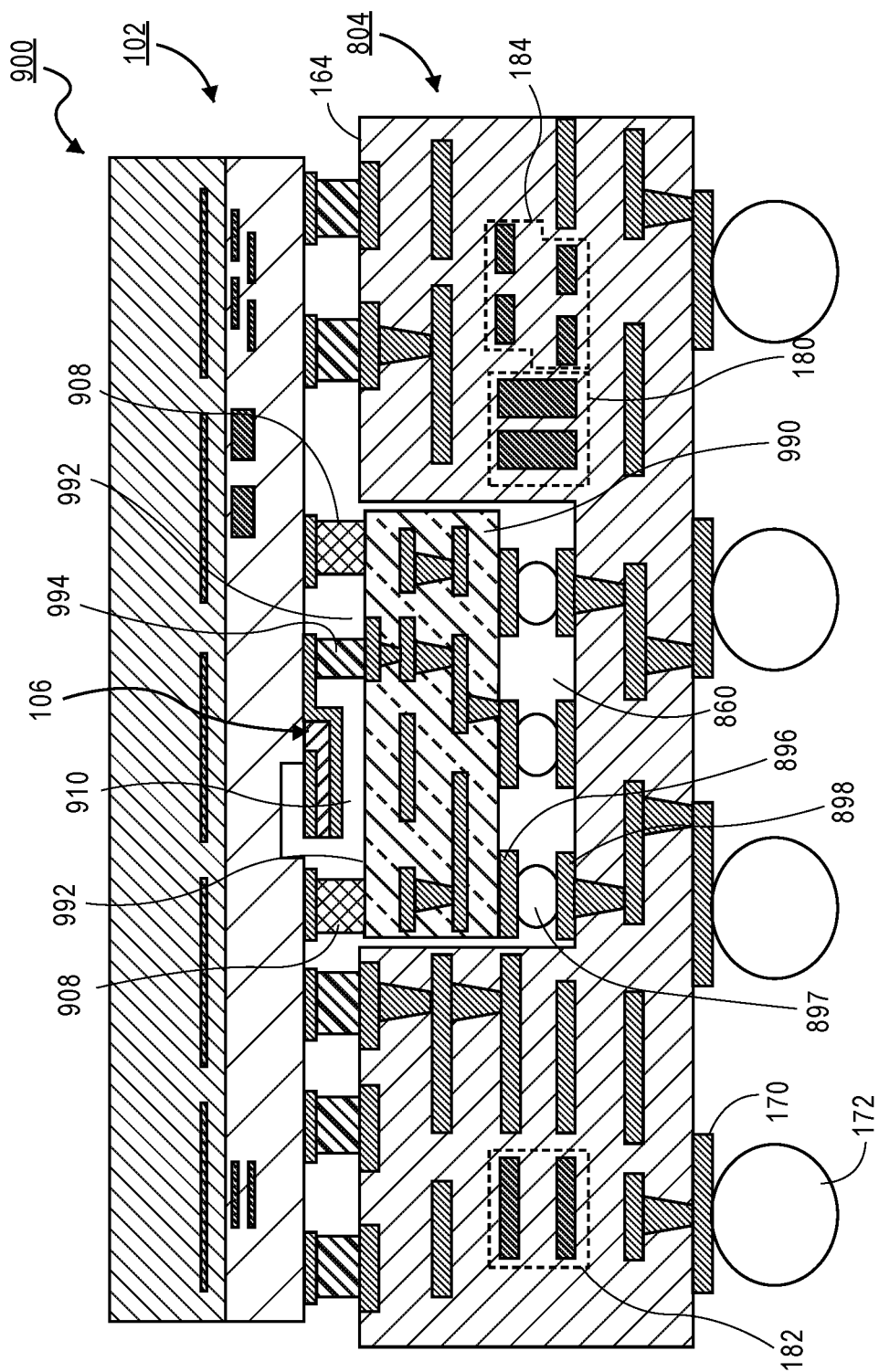
FIG. 9 is cross-sectional illustration of a packaged system in accordance with an embodiment of the present disclosure.

FIG. 9 is cross-sectional illustration of a packaged system 900 in accordance with an embodiment of the present disclosure. Packaged system 900 is similar to packaged system 800 except that packaged system 900 includes a cap 990 which does not include a cavity beneath resonator 106 as illustrated in FIG. 9. In an embodiment, cap 990 has a planar or substantially planar upper surface 992 nearest active die 102. Planar cap 990 may be easier and less expensive to manufacture than a cap with a recess or cavity disposed therein. In an embodiment, planar surface 992 of cap 990 is attached to active die 102 by a seal frame or ring 908. Seal frame 908 completely surrounds resonator 106 and creates a hermetic seal between interconnect structure 122 of active die 102 and cap 990. Seal frame 908, interconnect structure 122 and cap 990 form a hermetic and acoustically sealed air cavity 910 around resonator 106 which protects resonator 106 from environmental conditions and interference. Seal frame 908 may be made with any materials and processes, such as described with respect to seal frame 108. In an embodiment, seal frame 908 has thickness sufficient to space planar surface 992 of cap 990 sufficiently away from resonator 106 to allow resonator 106 to translate between 0.1-3 microns. In an embodiment, seal frame 908 has a thickness greater than 5 microns and in other embodiments has a thickness greater than 10 microns. In an embodiment, cap 990 is fully located in cavity 860 disposed in package substrate 804 as illustrated in FIG. 9.

Figure 10:
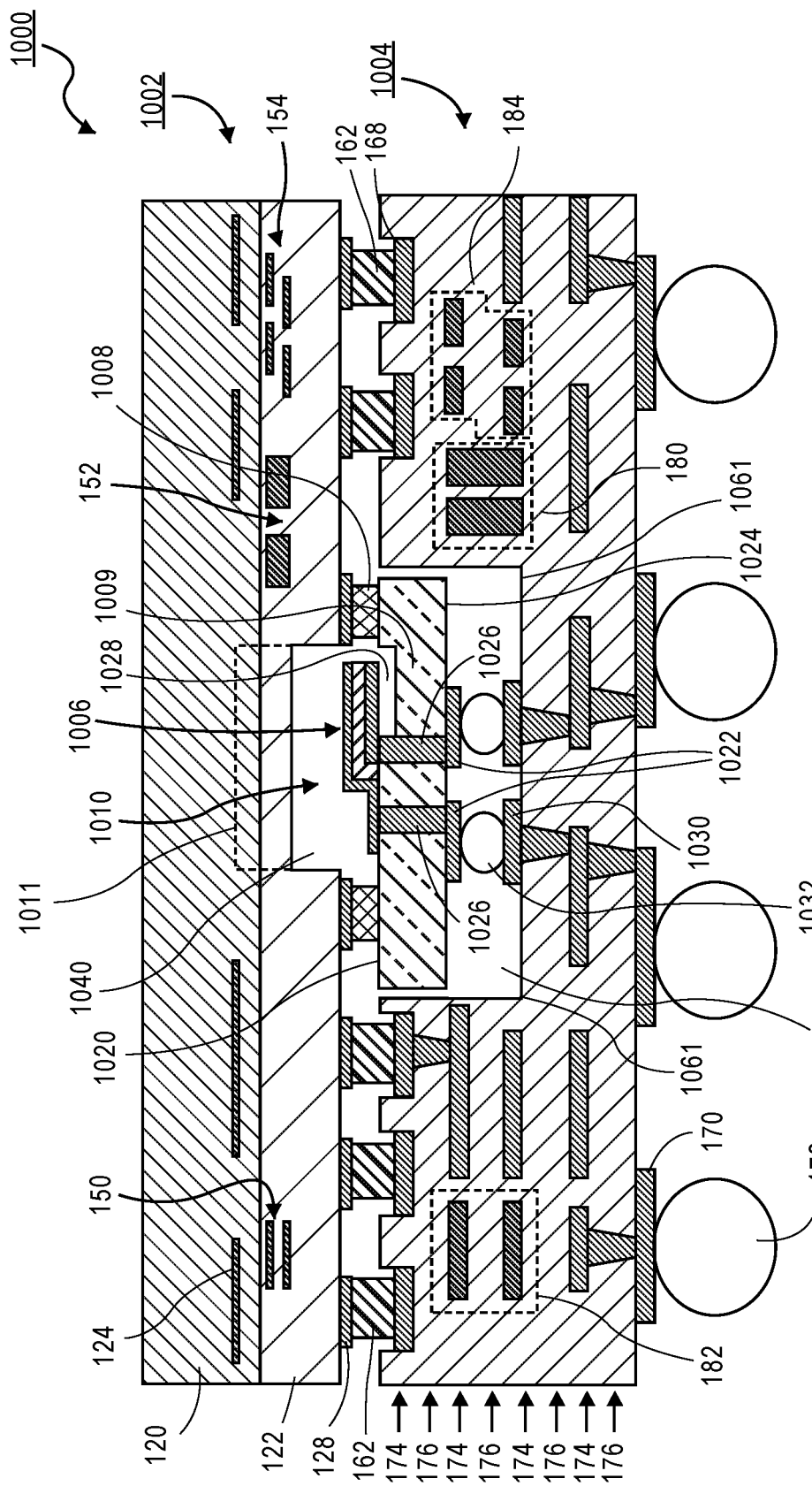
FIG. 10 is an illustration of a cross-sectional view of a packaged system which includes an active die electrically coupled to a package substrate, in accordance with an embodiment of the present disclosure.

FIG. 10 is an illustration of a cross-sectional view of a packaged system 1000 which includes an active die 1002 electrically coupled to a package substrate 1004, in accordance with an embodiment of the present disclosure. Packaged system 1000 includes an acoustic wave resonator (AWR) die or resonator die 1009 which includes one or more acoustic wave resonators (AWRs) or resonators 1006. In an embodiment, AWR die 1009 is attached to active die 1002 by a seal frame or ring 1008 which completely surrounds resonator 1006 to form a hermetically and/or acoustically sealed cavity 1010 as illustrated in FIG. 10.

In an embodiment, active die 1002 may be similar to active die 102 except that active die 1002 may not include a resonator 106. Active die 1002 may include active circuits and features and be similar to active die 102, for example, as indicated by like reference numbers. In an embodiment, a cavity 1040 may be disposed in active die 1002 to provide an air gap to enable resonator 1006 to translate between 0.1-3 microns. In an embodiment, cavity 1040 is formed in interconnect structure 122 by, for example removing, such as by etching, portions of interconnect structure 122 above resonator 1006. In an embodiment, cavity 1040 may extend through interconnect structure 122 and into substrate 120, as indicated by dotted lines 1011.

Package substrate 1004 may be a package substrate similar to package substrate 104 and may include similar features as represented by, for example, the same reference numerals. A top side 1020 of resonator die 1009 includes resonator 1006, and a bottom side 1024 of resonator die 1009 includes a plurality of contact or bond pads 1022 as illustrated in FIG. 10. Resonator 1006 may be similar to resonator 106 as described above. In an embodiment, a plurality of interconnects 1026 electrically couple contact pads 1022 to different electrodes of resonator 1006 as illustrated in FIG. 10. In an embodiment, interconnects 1026 are through substrate vias (TSVs) which may provide a direct electrical connection of contact pads 1022 to resonator 1006.

Through substrate vias may be formed by forming an opening, such as by laser drilling or etching, through AWR die 1009 and then filling the opening with a conductive material, such as copper or tungsten. In an embodiment, resonator die 1009 may include a cavity 1028 located beneath a cantilever portion of resonator 1006 to allow resonator 1006 to translate between 0.1-3 microns. In an embodiment, resonator die 1009 may be located in a cavity or recess 1060 formed in package substrate 1004. In an embodiment, a plurality of contact pads 1030 are disposed on a bottom surface 1061 of cavity 1060 as illustrated in FIG. 10. In an embodiment, contact pads 1030 may be electrically coupled to corresponding contact pads 1022 by contacts 1032, for example solder bumps or solder balls. In an embodiment, package substrate 1004 may include at least one metal layer 174 between cavity bottom surface 1061 and contact pads 170 to enable easy electrical coupling of resonator 1006 to one or more passive devices, such as inductor 180, capacitor 182, and transformer 184 embedded in package substrate 1004.

Figure 11:
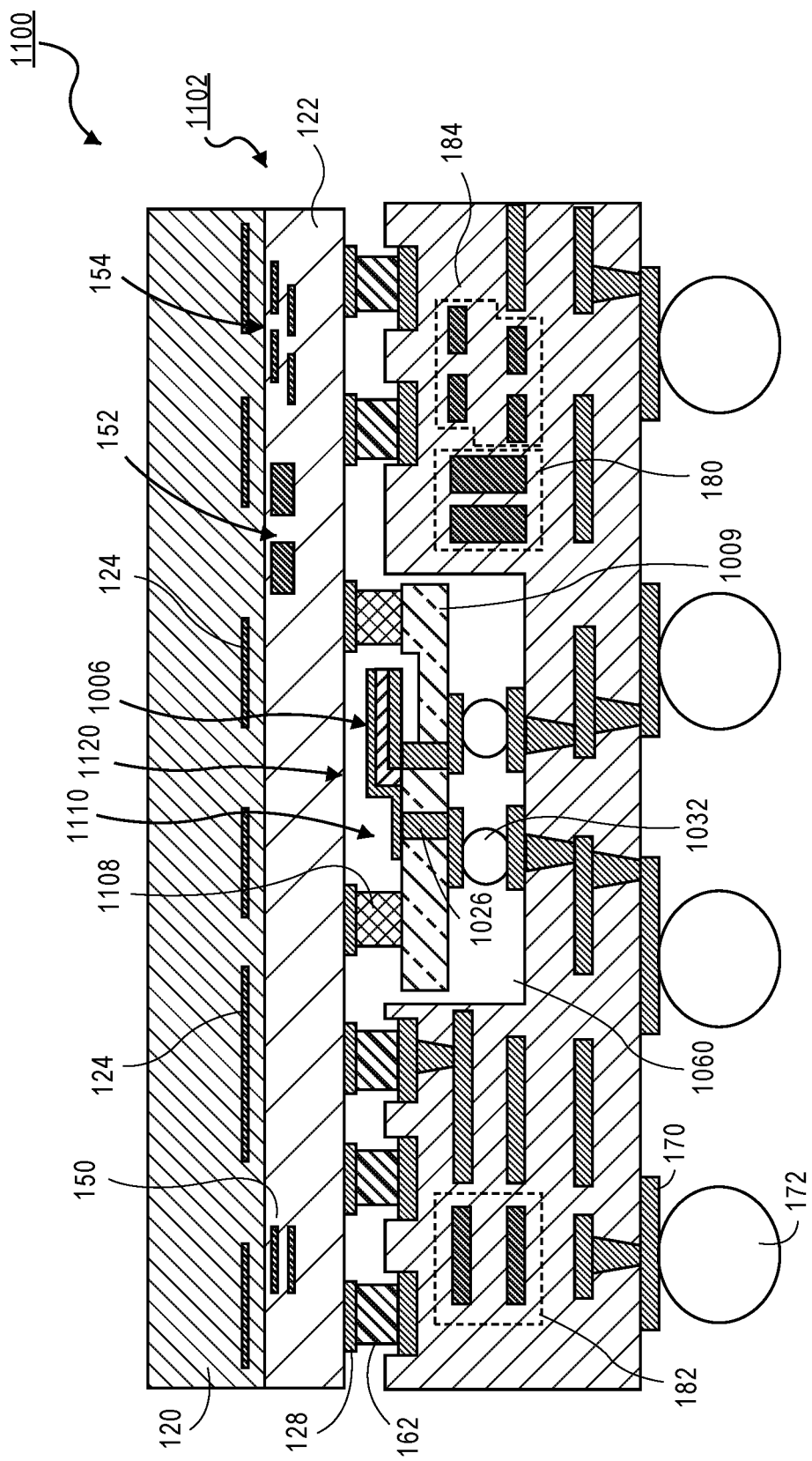
FIG. 11 is an illustration of a cross-sectional view of a packaged system in accordance with an embodiment of the present disclosure.

FIG. 11 is an illustration of a cross-sectional view of a packaged system 1100 in accordance with an embodiment of the present disclosure. Packaged system 1100 is similar to packaged system 1000 but includes an active die 1102. Active die 1102 may be similar to active die 1002 except that active die 1102 does not include a cavity 1010 disposed in interconnect structure 122 above resonator 1006 as illustrated in FIG. 11. In an embodiment, interconnect structure 122 includes a planar or substantially planar outer surface 1120 above resonator 1006. Not including a cavity in interconnect structure 122 above resonator 1006 may simplify the fabrication of interconnect structure 122 and improve reliability.

In an embodiment, resonator die 1009 is attached to planar surface 1120 of active die 1102 by a seal frame or ring 1108, which completely surrounds resonator 1006 and which creates a hermetic cavity 1110 around resonator 1006. In an embodiment, seal frame 1108 is sufficiently thick to provide sufficient space above resonator 1006 so that resonator 1006 may freely resonate between 0.1-3 microns. In an embodiment, seal frame 1108 has a thickness greater than 5 microns and in another embodiment has a thickness greater than 10 microns.

Figure 12:
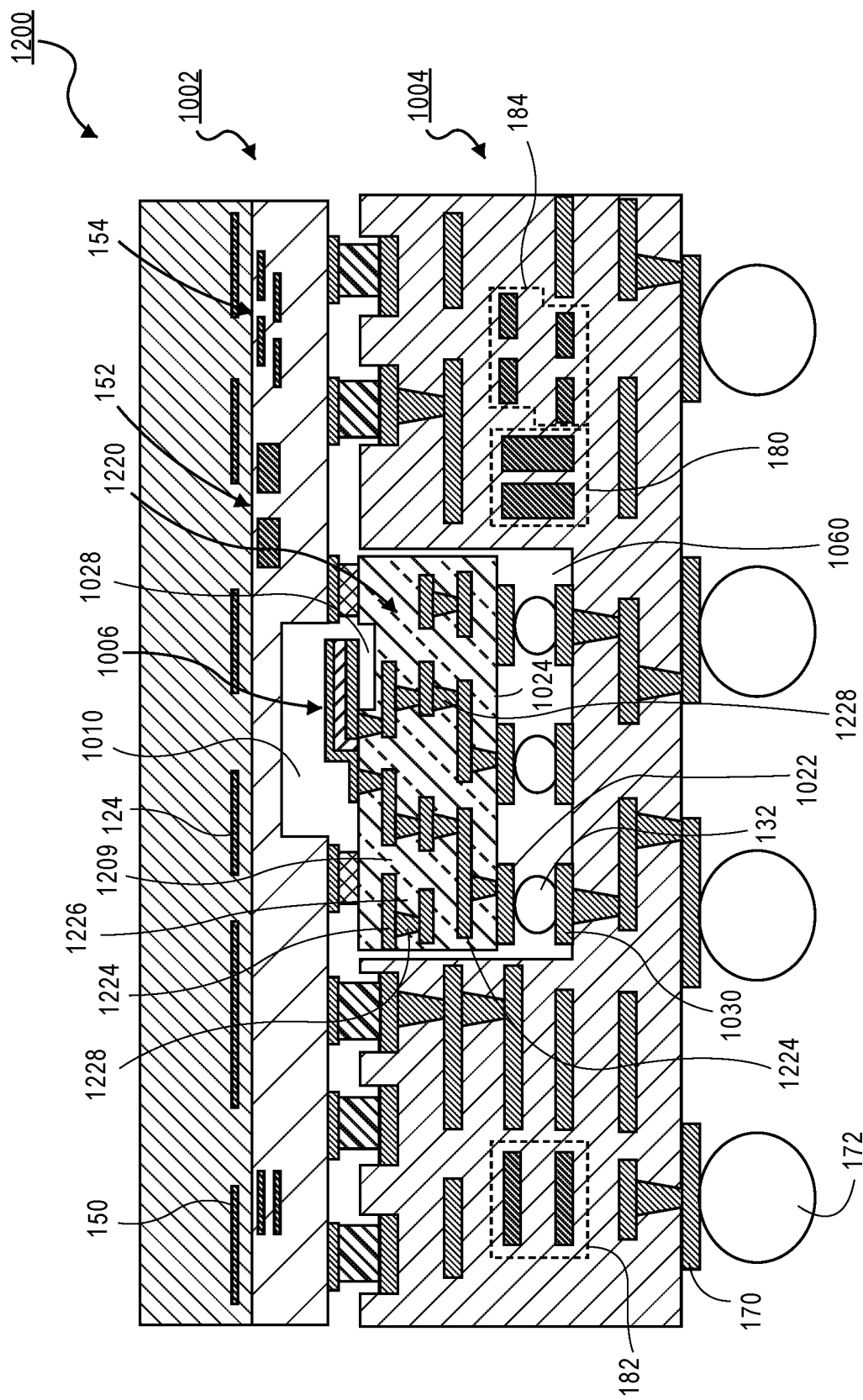
FIG. 12 is an illustration of a cross-sectional view of packaged system in accordance with an embodiment of the present disclosure.

FIG. 12 is an illustration of a cross-sectional view of a packaged system 1200 in accordance with an embodiment of the present disclosure. Packaged system 1200 is similar to packaged system 1000 except that it includes an AWR die 1209. AWR die 1209 is similar to AWR die 1009 but includes a multilayer interconnect structure 1220 disposed therein. Multilayer interconnect structure 1220 comprises vias and metal layers to provide electrical connections from bond pads 1022 disposed on a bottom surface 1024 of cap 1209 to resonator 1006 as illustrated in FIG. 12.

In an embodiment, interconnect structure 1220 includes multiple metallization layers 1224 separated by dielectric layers 1226. Conductive vias 1228 may electrically connect one level of metal to another level of metal. Each of the metal layers 1224 may contain a plurality of metal interconnects used to route signals and power to various devices in cap 1209. In an embodiment, the metal layers may be formed from any suitable metals or stacks of metals, such as but not limited to copper, aluminum, gold, cobalt, and titanium. Dielectric layers may be formed from any suitable dielectrics, such as but not limited to polyimide, BCB, silicon oxide, carbon doped silicon oxide, silicon oxynitride, and silicon nitride. In an embodiment, one or more capacitors may be disposed in cap 1209. Capacitors may be any suitable capacitors, such as but not limited to parallel plate capacitors, metal insulator metal (MIM) capacitors, interdigitated capacitors, and/or cap or trench capacitors. Capacitors may include a capacitor dielectric which may be an organic or an inorganic material, such as a silicon based epoxy, silicon oxide, silicon nitride, barium titanate, titanium oxide, or lead zirconium titanate. Capacitors may be fabricated as described in more detail with respect to FIGS. 16A and 16B. In an embodiment, a capacitor in interconnect structure 1220 is electrically coupled by electrical connection to resonator 1006.

In an embodiment, interconnect structure 1220 of cap 1209 may contain one or more inductors embedded therein. Inductors may be partial loop inductors, single loop inductors, or multi loop inductors fabricated in a single level or multiple levels of interconnect structure 1220 of cap 1209, and are further described in more detail with respect to FIGS. 17A-17F. In an embodiment, an inductor in interconnect structure 1220 is electrically coupled by electrical connection to resonator 1006.

Figure 13:
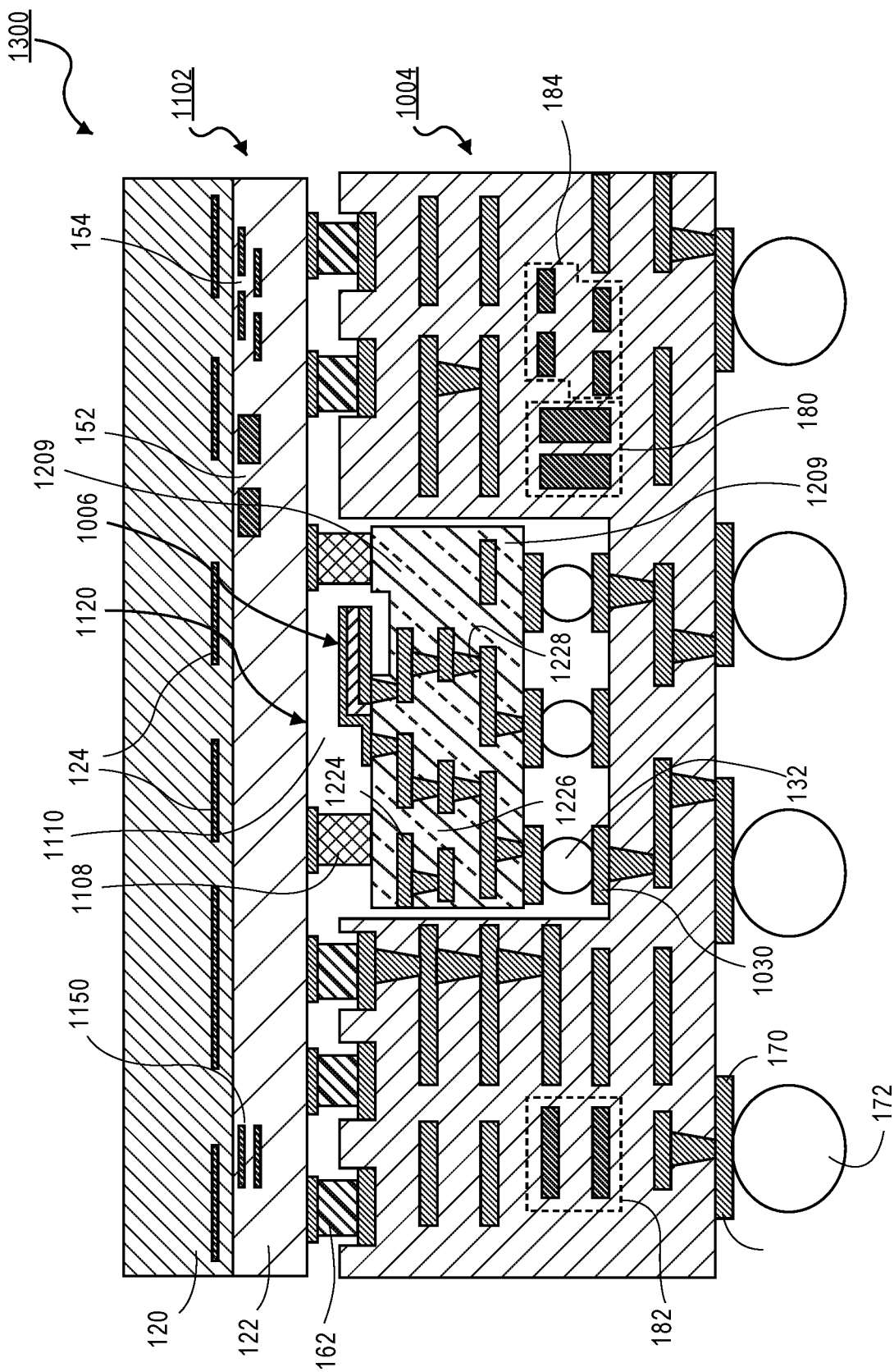
FIG. 13 is an illustration of a cross-sectional view of a packaged system in accordance with an embodiment of the present disclosure.

FIG. 13 is an illustration of a cross-sectional view of a packaged system 1300 in accordance with an embodiment of the present disclosure. Packaged system 1300 is similar to packaged system 1200 except that it includes an active die 1102 having a planar surface 1120 above resonator 1006. A seal frame or ring 1108 couples cap 1209 to planar surface 1120 to create a hermetic cavity 1110 around resonator 1006. In an embodiment, interconnect structure 122 includes planar or substantially planar outer surface 1120 above resonator 1006. Not including a cavity in interconnect structure 122 above resonator 1006 may simplify the fabrication of interconnect structure 122 and improve reliability.

Figure 14:
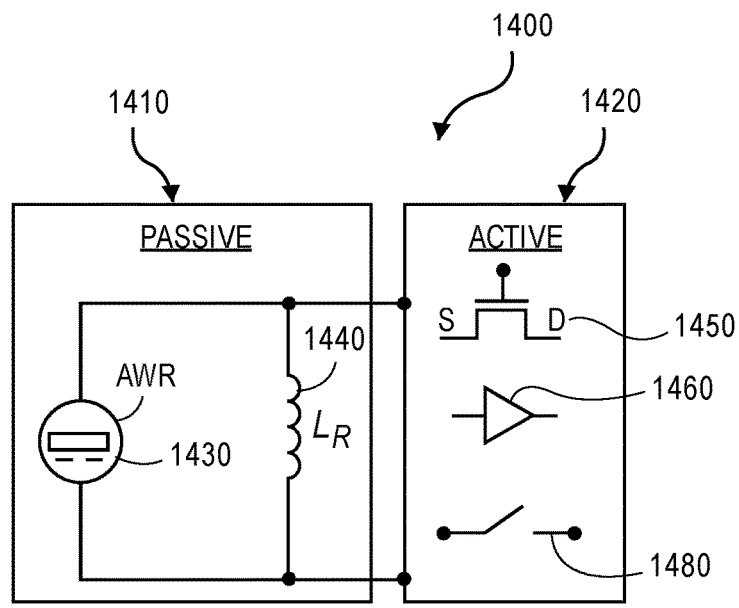
FIG. 14 is a schematic illustration of a RF front end system or module in accordance with an embodiment of the present disclosure.

FIG. 14 is a schematic illustration of an RF front end system or module 1400. RF module 1400 includes passive devices 1410 and active devices and circuits 1420. Passive devices 1410 may include an acoustic wave resonator 1430 and an inductor 1440 coupled together in parallel. The active devices and circuits 1420 may include transistors 1450, amplifiers 1460 and switches 1480. In an embodiment, passive devices 1410 may be coupled together to form a hybrid filter or bank of hybrid filters. In an embodiment, the hybrid filter is a hybrid filter 1500 such as described below in association with FIG. 15. In an embodiment, the passive devices 1410 and active devices and circuits 1420 are integrated together in a single packaged system, such as one of the packaged systems 100-1300 described above.

Embodiments of the present disclosure relate to hybrid filters and more particularly to filters having acoustic wave resonators (AWRs), lumped component resonators, and transformers and packages therefor. Embodiments of the present disclosure relate to a radio frequency (RF) hybrid filter having a plurality of acoustic wave resonators (AWR) and a transformer based resonator. The basic principle of the embodiments of the present disclosure consist of utilizing at least one RF transformer as the core of an LC resonator and one or more acoustic wave resonators to improve the out of band rejection of the resulting hybrid filter. The use of a transformer reduces the number of components in the filter. Additionally, the broadband nature of a transformer results in low parasitics and therefore enables filters operating at high frequencies. The filter can be further implemented by using an equivalent circuit of a transformer, such as a T-network or a Pi-network. In an embodiment, the hybrid circuit includes multiple parallel acoustic wave resonators to enhance the signal rejection in the guard band and at the band edge. The hybrid filter of the present disclosure may exhibit wide band width and sharp roll off. The hybrid filter of the present disclosure may be used in next generation mobile and wireless communication devices and infrastructures which require the handling of data at high rates, such as 5G networks. In embodiments, the filters of the present disclosure may exhibit excellent roll off and out of band rejection to enable multi-radio coexistence.

In embodiments of the present disclosure the hybrid filter is a hybrid LC/AWR (lumped component/acoustic wave resonator) filter comprising RF passive elements, such as inductors, transformers and capacitors, and acoustic wave resonators fabricated using a piezoelectric material, such as a thin film bulk acoustic resonator (FBAR to TFBAR). In an embodiment, a first winding of a transformer may be coupled to a first port and to a first acoustic wave resonator and a second acoustic wave resonator may be coupled to a second winding of the transformer and to a second port. A first capacitor may be coupled in parallel with the first winding of the inductor and a second capacitor may be coupled in parallel with a second winding of the transformer. A lumped element resonator comprising an inductor coupled in parallel with a capacitor may be disposed between the coupling of the first acoustic wave resonator and the first winding of the transformer.

Figure 15:
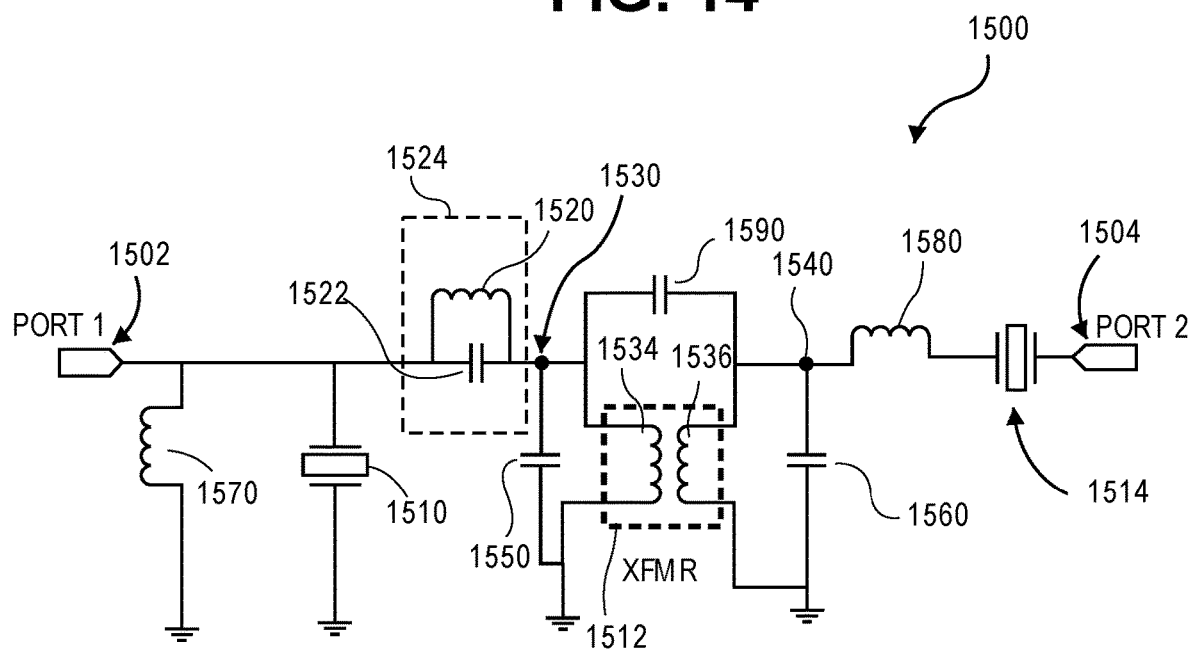
FIG. 15 is a schematic illustration of an RF hybrid circuit or filter in accordance with an embodiment of the present disclosure.

FIG. 15 is a schematic illustration of an RF hybrid circuit or filter 1500 in accordance with an embodiment of the present disclosure. Hybrid filter 1500 includes a first acoustic wave resonator (AWR) 1510, a lumped component resonator 1524, a transformer (XFMR) 1512 and a second acoustic wave resonator (AWR) 1514. In an embodiment, first AWR 1510 has a first electrode coupled to a first port or an input port 1502 and has a second electrode coupled to ground. In an embodiment, an inductor 1520 has a first terminal coupled to the first electrode of AWR 1510 and to the input port 1502 and a second terminal coupled to a first node 1530. A capacitor 1522 is coupled in parallel with inductor 1520. The capacitor 1522 and the inductor 1520 create a lump element resonator 1524 which forms a transmission zero either below or above the pass band region. A first coil or winding 1534 of transformer 1512 has a first terminal coupled to node 1530 and a second terminal couple to ground. A second coil or winding 1536 of transformer 1512 has a first terminal coupled to a node 1540 and a second terminal coupled to ground as illustrated in FIG. 15. A capacitor 1550 has a first electrode or plate coupled to node 1530 and in an embodiment a second electrode or plate coupled to ground. In an embodiment the second electrode of capacitor 1550 is directly connected to the second terminal of first winding 1534 of transformer 1512. A capacitor 1560 has a first electrode or plate coupled to node 1540 and in an embodiment has a second electrode or plate coupled to ground. In an embodiment, the second electrode of capacitor 1560 is directly connected to the second terminal of the second winding 1536 of transformer 1512. Although each of the second terminals of capacitor 1550 and capacitor 1560 are illustrated as being coupled to ground, they may each be, in an embodiment, connected to a same or different DC voltage in order to provide tuning capabilities. The poles of the filter are defined by capacitors 1550 and 1560 and transformer 1512. In an embodiment, filter 1500 has two poles and therefore may be considered a second order filter. In another embodiment, filter 1500 has more than two poles and may be considered a higher order filter.

Second AWR 1514 has a first electrode coupled to node 1540 and a second electrode coupled to a second port or output port 1504. In an embodiment, hybrid filter 1500 of FIG. 15 includes two acoustic wave resonators, AWR 1510 and AWR 1514. The acoustic wave resonators act as a transmission zero around the edge of the passband and therefore enable filter 1500 to achieve strong rejection in the adjacent guard band.

In an embodiment, filter 1500 may include one or more matching inductors. In an embodiment, filter 1500 includes an inductor 1570 having a first terminal coupled to input port 1502 and a second terminal coupled to ground. In an embodiment, filter 1500 may include an inductor 1580 disposed between second AWR 1514 and node 1540. In an embodiment, inductor 1580 has a first terminal coupled to node 1540 and a second terminal to the first electrode of AWR 1514, as illustrated in FIG. 15. In an embodiment, inductor 1570 and inductor 1580 are matching inductors and act as transmission zero (responsible for signal attenuation) at low and high frequencies, respectively.

In an embodiment, filter 1500 may include a capacitor 1590 having a first electrode or plate coupled to node 1530 and a second electrode or plate coupled to node 1540, as illustrated in FIG. 15. Capacitor 1590 may form another transmission zero with transformer 1512.

In embodiments of the present disclosure, individual ones of the inductors 1520, 1570, and 1580 may be implemented as a series combination of two or more smaller inductors to improve the frequency range of operation, the in-band and out of band performance at a cost of inductance density and/or quality factor. Similarly, individual ones of the capacitors 1522, 1550, 1560 and 1590 may be implemented as a parallel combination of two or more smaller capacitors. In an embodiment, the inductors may have an inductance in the range of 0.1 to 15 nanoHenrys (nH). In an embodiment, the capacitors may have a capacitance in the range of 0.1 to 15 picoFarads (pF).

First winding 1534 and second winding 1536 of transformer 1512 may be inductively coupled together. That is, first winding 1534 and second winding 1536 may be sufficiently close together to provide mutual inductive coupling. In an embodiment, first winding 1534 and second winding 1536 have a low inductive mutual coupling coefficient of between 0.01 to 0.5. In an embodiment, first winding 1534 and second winding 1536 are sufficiently sized to create an inductance ratio between 1:2-2:1. In an embodiment first winding 1534 and second winding 1536 have an inductance ratio of approximately 1:1. First winding 1534 may be considered the primary coil of transformer 1512 and second winding 1536 may be considered the secondary winding of transformer 1512. In an embodiment, transformer 1512 may be replaced with a transformer equivalent circuit such as a T-network of inductors or a Pi-network of inductors.

In an embodiment, hybrid filter 1500 is an RF band pass filter. Filter 1500 may reject signals at both low and high frequencies. The signal transmission between input port 1502 and output port 1504 is maximum in the desired passband region. In an embodiment, an RF analog input signal having a frequency between 800 MHz to 8 GHz is applied to input port 1502. In an embodiment, an analog signal between 3.3 to 4.2 GHz is provided to input port 1502. In yet another embodiment, an input signal between 4.4 to 4.9 GHz is provided to input port 1502. The input signal passes through filter 1500 and a filtered analog output signal is provided on output port 1504.

Figure 16A:
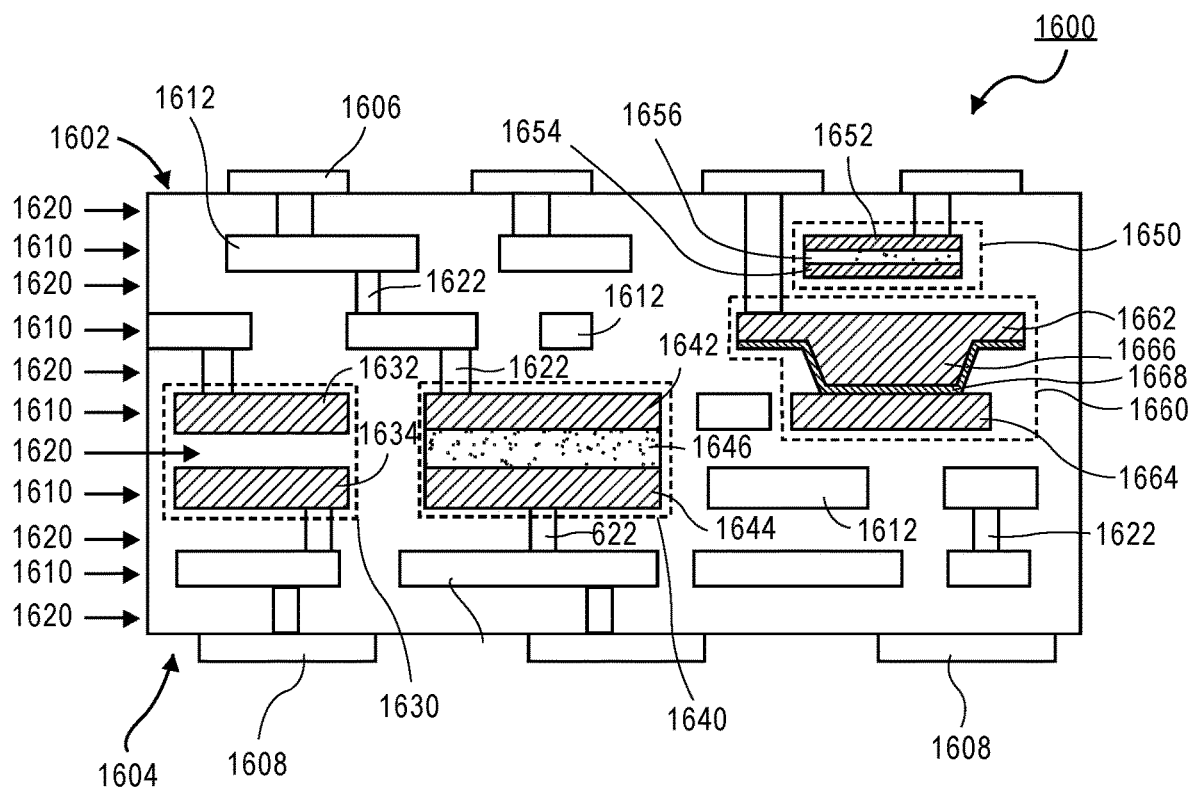
FIG. 16A and FIG. 16B illustrate various capacitors which may be integrated or embedded into a package substrate, in accordance with embodiments of the present disclosure.
Figure 16B:
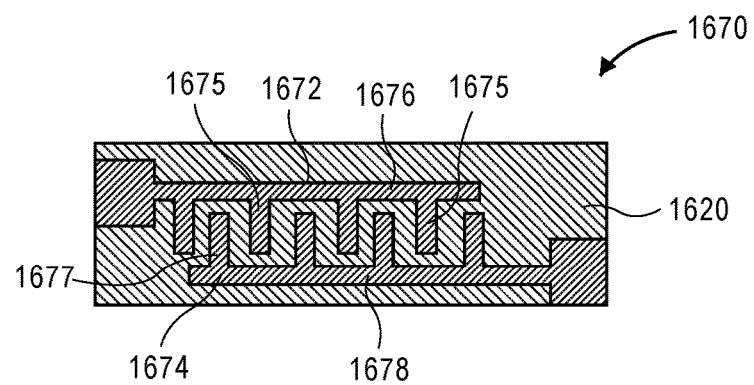

FIG. 16A and FIG. 16B illustrate various capacitors which may be integrated or embedded into a package substrate, into an active die, into a cap, or into an AWR die, in accordance with embodiments of the present disclosure. In embodiments, capacitors are thin film resonators consisting of metal electrodes and a loss tangent dielectric material between the electrodes. The quality of the capacitors increases with decreasing loss tangent. The capacitor dielectric material may have a high dielectric constant to reduce the footprint of the capacitor. In an exemplary embodiment, FIG. 16A is a cross sectional illustration of a multilayer package substrate 1600, such as a multilayer organic package substrate or a low temperature co-fired substrate. Substrate 1600 includes a first side 1602 and a second side 1604 opposite the first side 1602. A plurality of contact pads 1606 may be disposed on first side 1602 and a plurality of contact pads 1608 may be disposed on second side 1604. Multilayer substrate 1600 includes a plurality of metal layers 1610, such as copper layers. Each of the metal layers 1610 includes a plurality of metal traces or conductors 1612. A plurality of dielectric layers 1620, such as silicon dioxide or silicon oxide layers, are disposed between metal layers 1610 to electrically isolate the metal layers 1610 from one another. Dielectric layers 1620 may also be disposed between traces 1612 of metal layers 1610. A plurality of conductive vias 1622, such as copper vias, may be disposed in dielectric layers 1620 to enable electrical connections between adjacent metal layers 1610.

In an embodiment, package substrate 1600 may include a parallel plate capacitor 1630 which includes a first electrode or plate 1632 formed in one metal layer 1610 and a second electrode or plate 1634 formed in a second vertically adjacent metal layer 1610. In an embodiment, a portion of the dielectric layers 1620 between first electrode or plate 1632 and second electrode or plate 1634 forms the capacitor dielectric layer of capacitor 1630.

In an embodiment, package substrate 1600 may include one or more parallel plate capacitors 1640 which includes a first electrode or plate 1642 formed in one metal layer 1610 and a second electrode or plate 1644 disposed in a second vertically adjacent metal layer 1610. Capacitor 1640 may include a capacitor dielectric 1646 formed of a dielectric material which is different than the dielectric material 1620 used to isolate the metal layers 1610 of package substrate 1600. In an embodiment, dielectric 1646 is a high dielectric constant material, such as a metal oxide dielectric material, e.g., aluminum oxide, zirconium oxide, hafnium oxide, BST or PZT. In an embodiment, dielectric 1646 is a low loss tangent dielectric material. In this way, a high performance capacitor may be fabricated.

In an embodiment, package substrate 1600 may include one or more parallel plate capacitors 1650. Capacitor 1650 includes a first electrode or plate 1652, a second electrode or plate 1654 and an intervening capacitor dielectric 1656 disposed there between. In an embodiment, capacitor 1650 is disposed in a single metal layer 1610 of substrate 1600 as illustrated in FIG. 16A. In an embodiment, capacitor dielectric 1656 may be formed from a dielectric material having a high dielectric constant, such as a high k dielectric and which is different than the dielectric material 1620 used to form package substrate 1600. In an embodiment, dielectric 1656 is a high dielectric constant material, such as a metal oxide dielectric material, e.g., aluminum oxide, zirconium oxide, hafnium oxide, BST or PZT. In an embodiment, dielectric 1656 is a low loss tangent dielectric material. In this way, a high performance capacitor may be fabricated.

In an embodiment, package substrate 1600 may include one or more capacitors 1660 as illustrated in FIG. 16A. Capacitor 1660 includes a top electrode 1662 and a bottom electrode 1664. Top electrode 1662 includes a via portion 1666. Via portion 1666 is separated from bottom electrode 1664 by a capacitor dielectric 1668. Capacitor dielectric 1668 may be deposited in a via opening prior to filling the via with a conductive material, such as copper. In an embodiment, capacitor dielectric 1668 is a high k dielectric layer, such as a metal oxide, such as hafnium oxide or aluminum oxide. In an embodiment, capacitor dielectric 1668 is a low loss dielectric material. In an embodiment, capacitor dielectric 1668 is a different dielectric material than dielectric material 1620. In an embodiment, capacitor dielectric 1668 is a high dielectric constant material, such as a metal oxide dielectric material, e.g., aluminum oxide, zirconium oxide, hafnium oxide, BST or PZT. In an embodiment, capacitor dielectric 1668 is a low loss tangent dielectric material. In this way, a high performance capacitor may be fabricated.

FIG. 16B illustrates a plan view of a capacitor 1670 which may be embedded in package substrate 1600 in accordance with embodiments of the present disclosure. Capacitor 1670 includes a first electrode 1672 and a second electrode 1674. First electrode 1672 includes a plurality of fingers 1675 extending from a back bone 1676 which are interleaved or interdigitated with a plurality of fingers 1677 extending from a back bone 1678 of second electrode 1674 as illustrated in FIG. 16B. In an embodiment, first electrode 1672 and second electrode 1674 are disposed in a same metal layer 1610 or plane of package substrate 1600. Dielectric layer 1620 disposed between the back bone and fingers of the electrodes may act as a capacitor dielectric. In an embodiment, dielectric material 1620 disposed between the electrodes may be replaced with a different dielectric material, such as a high k dielectric material and/or a low loss tangent dielectric material, if desired.

Figure 17A:
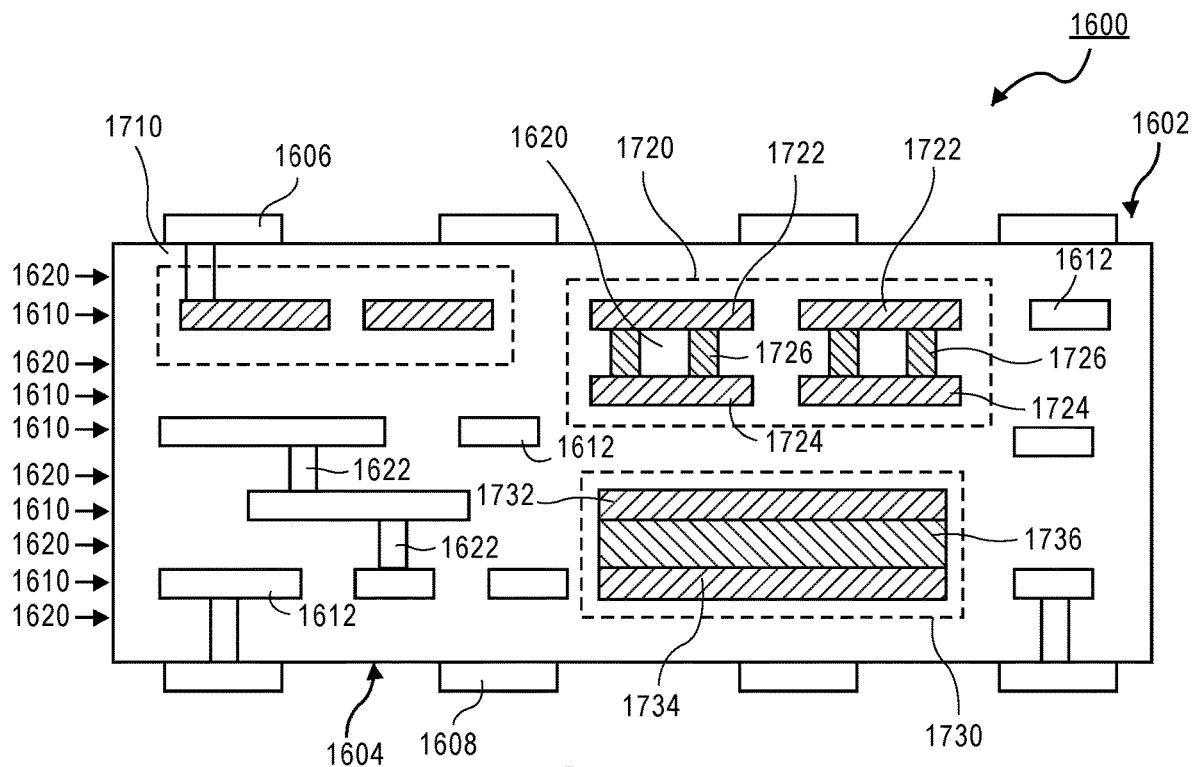
FIGS. 17A-17F illustrate various inductors which may be embedded into a package substrate in accordance with embodiments of the present disclosure.
Figure 17B:
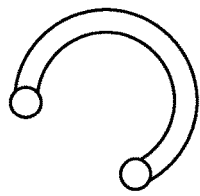
Figure 17C:
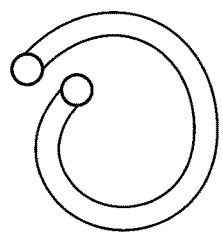
Figure 17D:
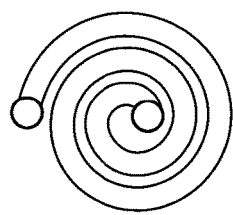

FIGS. 17A-17F illustrate various inductors which may be embedded into a package substrate in accordance with embodiments of the present disclosure. FIG. 17A is a cross-sectional illustration of package substrate 1600 which in an embodiment may include one or more inductors formed from one or more metal layers 1610 of package substrate 1600. In an embodiment, package substrate 1600 may include one or more inductors 1710. In an embodiment, inductor 1710 has a loop disposed in a single metal layer 1610 of package substrate 1600. Inductor 1710 may have a partial or fractional loop, as illustrated in FIG. 17B, a full loop, as illustrated in FIG. 17C, or multiple loops, such as two or more loops as illustrated in FIG. 17D.

In an embodiment, package substrate 1600 may include one or more inductors 1720. Inductor 720 may include one or more loops including a first metal portion 1722 disposed in a first metal layer 1610 of package substrate 1600 and a second metal portion 1724 disposed in a second metal layer 1610 vertically adjacent to the first metal layer 1610. The first metal portion 1722 is electrically coupled to the second metal portion 1724 by a plurality of metal vias 1726, as illustrated in FIG. 17A. In this way, an inductor 1720 may have a loop with a metal thickness greater than the metal thickness of a single metal layer 1610 of package substrate 1600 and thereby yield a high Q inductor. By increasing the thickness of the conductors of inductor 1720, an inductor having a Q factor of 100 or better at the frequency of operation may be achieved.

Figure 17E:
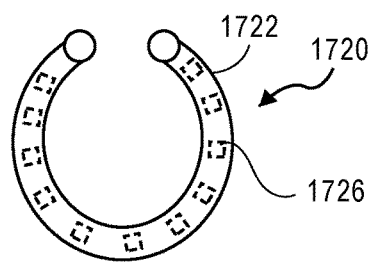

FIG. 17E is a plan view of inductor 1720 showing a top portion 1722 of a loop and the underlying vias 1726 electrically connected thereto. Dielectric material 1620 may be disposed between conductive vias 1726 and between the first metal portion 1722 and a second metal portion 1724. If desired, inductor 1720 may include a third metal portion disposed in a third metal layer 1610 and be electrically connected to second metal portion 1724 by a second plurality of conductive vias. In an embodiment of the present disclosure, the plurality of conductive vias 1726 and 1622 may be formed by laser drilling a plurality of via openings in the dielectric layer 1610 and then filling the vias with a conductive material, such as copper, when forming the metal layer 1610 above. Laser drilling provides a cost effective method of creating vias 1726 and 1622.

Figure 17F:
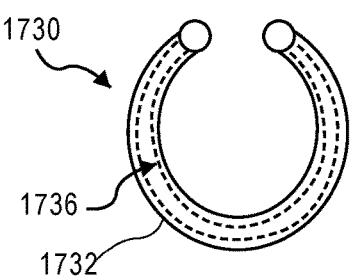

In an embodiment, package substrate 1600 may include one or more inductors 1730 as illustrated in FIG. 17A. Inductor 1730 includes a first metal portion 1732 disposed in a first metal layer 1610 and a second metal portion 1734 disposed in a second metal layer 1610 vertically adjacent to the first metal layer 1610. A slot via or trench via 1736 may be used to connect first metal portion 1732 with second metal portion 1734. Trench via 1734 may have a length substantially equal to, or at least 90% of, the length of the loop or loops included in metal portions 1732 and 1734, as illustrated in FIG. 17F. In an embodiment, trench via 1736 has a width which is less than the width of metal portions 1732 and 1734. Trench vias 1736 may be formed by lithographically patterning a trench opening in dielectric layer 1620 by, for example, lithographically patterning a photoresist mask and then etching a trench opening in alignment with the photoresist mask. Alternatively, dielectric layer 1620 may be a photo definable dielectric and may be directly photo defined to form a trench opening therein. The trench opening may be subsequently filled when forming metal layer 1610 which includes metal portion 1732. Inductor 1730 may be able to exhibit a higher Q factor than inductor 1722 because inductor 1730 has a trench via which substantially or completely connects the metal portion 1732 with the metal portion 1734 while inductor 1720 is coupled by vias and has dielectric 1620 between metal portions 1722 and 1724, as illustrated in FIG. 71E.

It is to be appreciated that inductors such as inductors 1710, 1720 and 1730 may be stand-alone inductors or may be combined with other inductors to fabricate windings of a transformer or a transformer-equivalent circuit.

Figure 18:
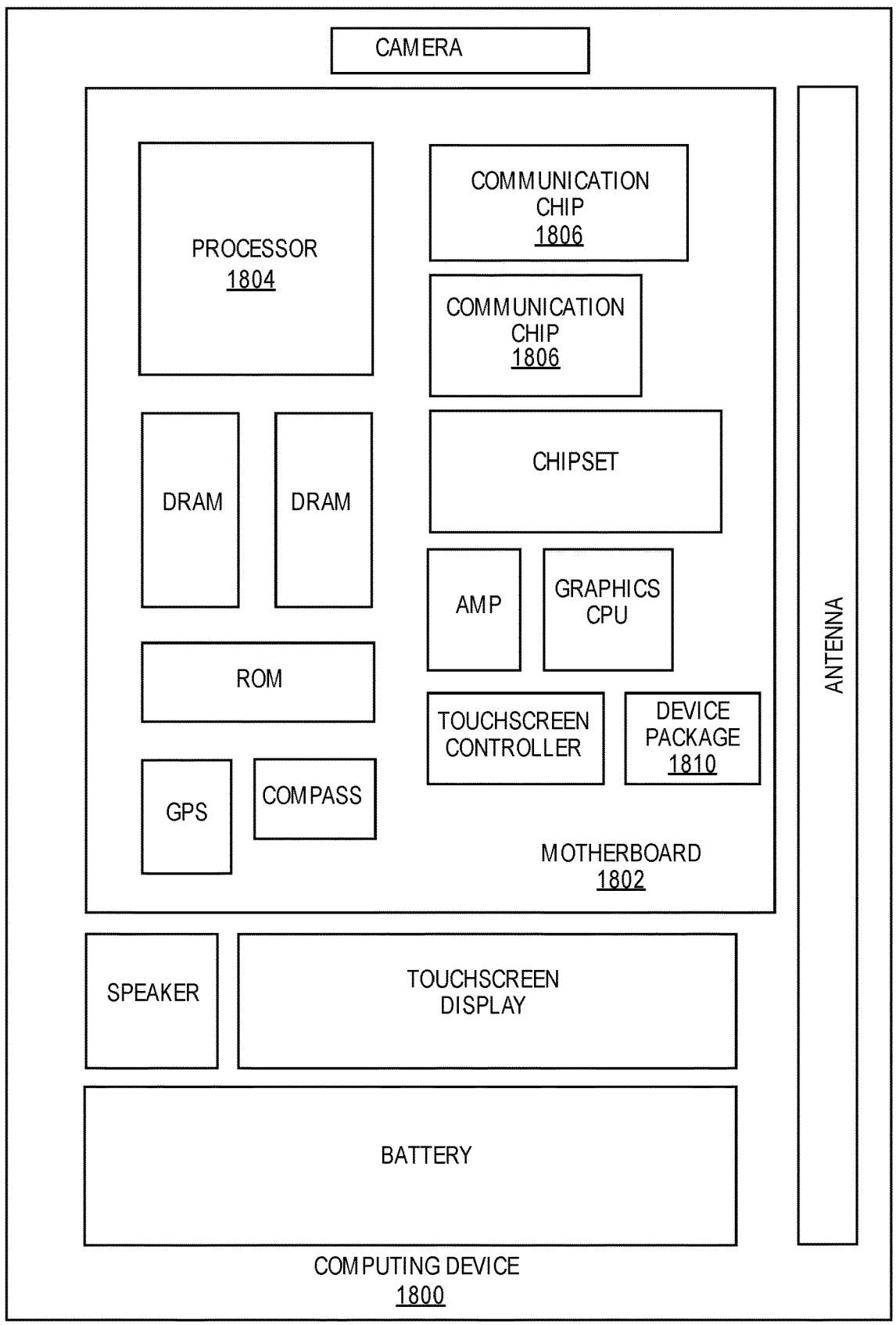
FIG. 18 is a schematic block diagram illustrating a computer system that utilizes a packaged system as described herein, in accordance with an embodiment of the present disclosure.

FIG. 18 is a schematic block diagram illustrating a computer system that utilizes a packaged system as described herein, in accordance with an embodiment of the present disclosure. FIG. 18 illustrates an example of a computing device 1800. Computing device 1800 houses motherboard 1802. Motherboard 1802 may include a number of components, including but not limited to processor 1804, device package 1810, and at least one communication chip 1806. Processor 1804 is physically and electrically coupled to motherboard 1802. For some embodiments, at least one communication chip 1806 is also physically and electrically coupled to motherboard 1802. For other embodiments, at least one communication chip 1806 is part of processor 1804.

Depending on its applications, computing device 1800 may include other components that may or may not be physically and electrically coupled to motherboard 1802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 1806 enables wireless communications for the transfer of data to and from computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 1806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1800 may include a plurality of communication chips 1806. For instance, a first communication chip 1806 may be dedicated to shorter range wireless communications such as Wi-Fi and Bluetooth and a second communication chip 1806 may be dedicated to longer range wireless communications such as GPS, EDGE, GPRS, CDMA, WiMAX, LTE, Ev-DO, and others.

Processor 1804 of computing device 1800 includes an integrated circuit die packaged within processor 1804. Device package 1810 may be, but is not limited to, a packaging substrate and/or a printed circuit board. Note that device package 1810 may be a single component, a subset of components, and/or an entire system.

For some embodiments, the integrated circuit die may be packaged with one or more devices on device package 1810 that include a thermally stable RFIC and antenna for use with wireless communications. The term "processor" may refer to any device or portion of a device that processes electronic data from registers and/or memory to transform that electronic data into other electronic data that may be stored in registers and/or memory.

At least one communication chip 1806 also includes an integrated circuit die packaged within the communication chip 1806. For some embodiments, the integrated circuit die of the communication chip may be packaged with one or more devices on the device package 1810, as described herein.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A package includes an active die comprising an acoustic wave resonator. A package substrate is electrically coupled to the active die. A seal frame surrounds the acoustic wave resonator and attached to the active die and to the package substrate, the seal frame hermetically sealing the acoustic wave resonator in a cavity between the active die and the package substrate.

Example Embodiment 2

The package of example embodiment 1 wherein the seal frame comprises a metal selected from the group consisting of gold, copper, tin, and indium.

Example Embodiment 3

The package of example embodiment 1 or 2 wherein the seal frame comprises a first metal layer on the active die and a second metal layer on the package substrate.

Example Embodiment 4

The package of example embodiment 3 wherein the first metal layer is bonded to the second metal layer by metal to metal diffusion bonding.

Example Embodiment 5

The package of example embodiment 3 wherein the first metal layer is bonded to the second metal layer by a solder connection.

Example Embodiment 6

The package of example embodiment 1 wherein the seal frame comprises a material selected from the group consisting of a glass frit, a polymer, and an inorganic dielectric.

Example Embodiment 7

The package of example embodiment 1, 2, 3, 4, 5 or 6 further comprising a substrate cavity disposed in the package substrate beneath the acoustic wave resonator.

Example Embodiment 8

The package of example embodiment 1, 2, 3, 4, 5 or 6 further comprising an active die cavity disposed in the active die above the acoustic wave resonator.

Example Embodiment 9

The package of example embodiment 1, 2, 3, 4, 5, 6, 7 or 8 wherein the package substrate is selected from the group consisting of a glass substrate and a ceramic substrate.

Example Embodiment 10

The package of example embodiment 1, 2, 3, 4, 5, 6, 7 or 8 wherein the package substrate is a multilayer organic substrate.

Example Embodiment 11

The package of example embodiment further comprising a hermetic coating on a surface of the package substrate nearest the active die, wherein the hermetic coating is surrounded by the seal frame.

Example Embodiment 12

The package of example embodiment 11 wherein the hermetic coating is an inorganic dielectric.

Example Embodiment 13

The package of example embodiment 12 wherein the hermetic coating is selected from the group consisting of silicon oxide and silicon nitride.

Example Embodiment 14

The package of example embodiment 10 further comprising a cavity disposed in the package substrate on a side nearest the active die, wherein the cavity is lined with a hermetic coating.

Example Embodiment 15

The package of example embodiment 10 wherein the package substrate comprises a plurality of metal layers, a plurality of dielectric layers, and a plurality of vias wherein the cavity has a sidewall comprising one of the vias of the plurality of vias.

Example Embodiment 16

The package of example embodiment 15 further comprising a hermetic coating on a sidewall of the cavity.

Example Embodiment 17

The package of example embodiment 1, 2, 3, 4, 5, 6, 7, 8, 9, 10, 11, 12, 13, 14, 15 or 16 wherein the package substrate comprises a passive device, wherein the passive device is electrically coupled to an electrode of the acoustic wave resonator, wherein the passive device is selected from the group consisting of a resistor, a capacitor, an inductor, and a transformer.

Example Embodiment 18

A package comprising: an active die comprising an acoustic wave resonator. A cap is coupled to the active die, the cap over the acoustic wave resonator. A package substrate has an active die side electrically coupled to the active die, the package substrate having a cavity, the cap disposed in the cavity.

Example Embodiment 19

The package of example embodiment 18 further comprising a seal frame, the seal frame surrounding the acoustic wave resonator, the seal frame attaching the cap to the active die.

Example Embodiment 20

The package of example embodiment 18 or 19 wherein the cap has a cavity on a side nearest the acoustic wave resonator.

Example Embodiment 21

The package of example embodiment 19 wherein the cap has a planar surface on a side nearest the acoustic wave resonator, the planar surface under the acoustic wave resonator and attached to the seal frame.

Example Embodiment 22

The package of example embodiment 18, 19, 20 or 21 wherein the cap further comprises a plurality of electrical connections therein, wherein the plurality of electrical connections electrically couple the package substrate to the acoustic wave resonator.

Example Embodiment 23

The package of example embodiment 22 further comprising a plurality of contact pads on the package substrate in the cavity, the contact pads electrically coupled to the electrical connections in the cap.

Example Embodiment 24

The package of example embodiment 22 wherein the cap has a cavity disposed in a surface nearest the acoustic wave resonator, the cavity under the acoustic wave resonator.

Example Embodiment 25

The package of example embodiment 22 wherein no electrical routing to the acoustic wave resonator is disposed over the seal ring.

Example Embodiment 26

The package of example embodiment m 22 wherein the cap includes a multilayer interconnect structure, the multilayer interconnect structure comprising a plurality of metal layers, a plurality of dielectric layers and a plurality of conductive vias wherein the plurality of electrical interconnections are disposed in the multilayer interconnect structure.

Example Embodiment 27

The package of example embodiment 18, 19, 20, 21, 22, 23, 24, 25 or 26 further comprising a passive device disposed in the cap, wherein the passive device is selected from the group consisting of an inductor, a capacitor, a resistor, and a transformer, wherein the passive device is electrically coupled to an electrode of the acoustic wave resonator.

Example Embodiment 28

The package of example embodiment 18, 19, 20, 21, 22, 23, 24, 25, 26 or 27 wherein the active die comprises a semiconductor substrate, and an interconnect structure disposed on the semiconductor substrate, wherein the acoustic wave resonator is disposed in the interconnect structure.

Example Embodiment 29

The package of example embodiment 28 wherein a cavity is disposed in the interconnect structure above the acoustic wave resonator.

Example Embodiment 30

A package includes an active die comprising a semiconductor substrate and an interconnect structure disposed on the semiconductor substrate, the active die comprising an active circuit. A resonator die is coupled to the active die, the resonator die comprising an acoustic wave resonator; a package substrate, the package substrate electrically coupled to the active die, and to the resonator die.

Example Embodiment 31

The package of example embodiment 30 further comprising a seal frame, the seal frame surrounding the acoustic wave resonator and attached to the active die and to the resonator die.

Example Embodiment 32

The package of example embodiment 30 further comprising a substrate cavity in the package substrate, the resonator die in the substrate cavity in the package substrate.

Example Embodiment 33

The package of example embodiment 30 further comprising a die cavity in the active die, the cavity above the acoustic wave resonator of the resonator die.

Example Embodiment 34

The package of example embodiment 33 wherein the die cavity is disposed in the interconnect structure of the active die.

Example Embodiment 35

The package of example embodiment 34 wherein the die cavity is in the semiconductor substrate of the active die.

Example Embodiment 36

The package of example embodiment 35 wherein there is no cavity disposed in the active die above the acoustic wave resonator.

Example Embodiment 37

The package of example embodiment 30, 31, 32, 33, 34, 35 or 36 further comprising a plurality of through substrate vias in the resonator die, the through substrate vias extending from a first side of the resonator die to a second side of the resonator die.

Example Embodiment 38

The package of example embodiment 37 wherein one of the plurality of through substrate vias is electrically coupled to a first electrode of the acoustic wave resonator, and wherein a second of the plurality of through substrate vias is electrically coupled to a second electrode of the acoustic wave resonator.

Example Embodiment 39

The package of example embodiment 30, 31, 32, 33, 34, 35, 36, 37 or 38 wherein the resonator die further comprises a multilayer interconnect structure, the multilayer interconnect structure comprising a plurality of metal layers, a plurality of dielectric layers, and a plurality of conductive vias.

Example Embodiment 40

The package of example embodiment 39 wherein the multilayer interconnect structure includes an electrical connection extending from a first side of the resonator die to a second side of the resonator die wherein the first electrical connection is electrically coupled to a first electrode of the acoustic wave resonator and wherein the multilayer interconnect structure includes a second electrical connection extending from the first side of the resonator die to a second side of the resonator die and wherein the second electrical connection is coupled to a second electrode of the acoustic wave resonator.

Example Embodiment 41

The package of example embodiment 39 further comprising a passive device disposed in the multilayer interconnect structure of the resonator die, wherein the passive device is selected from the group consisting of a resistor, a capacitor, an inductor, and a transformer.

Example Embodiment 42

The package of example embodiment 30, 31, 32, 33, 34, 35, 36, 37, 38, 39, 40 or 41 wherein the active circuit is selected from the group consisting of an amplifier, a switch, a tunable matching network and a power delivery network.

Example Embodiment 43

The package of example embodiment 42 wherein the active circuit is an amplifier and wherein the amplifier is selected from the group consisting of a low noise amplifier and a power amplifier.

What is claimed is:

1. A package comprising:
   an active die comprising an acoustic wave resonator;
   a package substrate electrically coupled to the active die;
   a seal frame surrounding the acoustic wave resonator and attached to the active die and to the package substrate, the seal frame hermetically sealing the acoustic wave resonator in a cavity between the active die and the package substrate;
   a substrate cavity disposed in the package substrate beneath the acoustic wave resonator; and
   an active die cavity disposed in the active die above the acoustic wave resonator, wherein the cavity between the active die and the package substrate is continuous with both the active die cavity and the substrate cavity.

2. The package of claim 1 wherein the seal frame comprises a metal selected from the group consisting of gold, copper, tin, and indium.

3. The package of claim 1 wherein the seal frame comprises a first metal layer on the active die and a second metal layer on the package substrate.

4. The package of claim 3 wherein the first metal layer is bonded to the second metal layer by metal to metal diffusion bonding.

5. The package of claim 3 wherein the first metal layer is bonded to the second metal layer by a solder connection.

6. The package of claim 1 wherein the seal frame comprises a material selected from the group consisting of a glass frit, a polymer, and an inorganic dielectric.

7. The package of claim 1 wherein the package substrate is selected from the group consisting of a glass substrate and a ceramic substrate.

8. The package of claim 1 wherein the package substrate is a multilayer organic substrate.

9. The package of claim 8 further comprising a hermetic coating on a surface of the package substrate nearest the active die, wherein the hermetic coating is surrounded by the seal frame.

10. The package of claim 9 wherein the hermetic coating is an inorganic dielectric.

11. The package of claim 10 wherein the hermetic coating is selected from the group consisting of silicon oxide and silicon nitride.

12. The package of claim 8 wherein the substrate cavity is disposed in the package substrate on a side nearest the active die, wherein the cavity is lined with a hermetic coating.

13. The package of claim 8 wherein the package substrate comprises a plurality of metal layers, a plurality of dielectric layers, and a plurality of vias wherein the cavity has a sidewall comprising one of the vias of the plurality of vias.

14. The package of claim 13 further comprising a hermetic coating on a sidewall of the cavity.

15. The package of claim 1 wherein the package substrate comprises a passive device, wherein the passive device is electrically coupled to an electrode of the acoustic wave resonator, wherein the passive device is selected from the group consisting of a resistor, a capacitor, an inductor, and a transformer.

16. A package comprising:
    an active die comprising an acoustic wave resonator;
    a cap coupled to the active die, the cap over the acoustic wave resonator;
    a package substrate having an active die side electrically coupled to the active die, the package substrate having a cavity, the cap disposed in the cavity; and
    a seal frame, the seal frame surrounding the acoustic wave resonator, the seal frame attaching the cap to the active die.

17. The package of claim 16 wherein the cap has a further cavity on a side nearest the acoustic wave resonator.

18. A package comprising:
    an active die comprising a semiconductor substrate and an interconnect structure disposed on the semiconductor substrate, the active die comprising an active circuit;
    a resonator die coupled to the active die, the resonator die comprising an acoustic wave resonator;
    a package substrate, the package substrate electrically coupled to the active die, and to the resonator die; and
    a seal frame, the seal frame surrounding the acoustic wave resonator and attached to the active die and to the resonator die.

19. The package of claim 18 further comprising a substrate cavity in the package substrate, the resonator die in the substrate cavity in the package substrate.

20. The package of claim 18 further comprising a die cavity in the active die, the cavity above the acoustic wave resonator of the resonator die.

21. The package of claim 20 wherein the die cavity is disposed in the interconnect structure of the active die.

22. A package comprising:
    an active die comprising a semiconductor substrate and an interconnect structure disposed on the semiconductor substrate, the active die comprising an active circuit;
    a resonator die coupled to the active die, the resonator die comprising an acoustic wave resonator;
    a package substrate, the package substrate electrically coupled to the active die, and to the resonator die; and a substrate cavity in the package substrate, the resonator die in the substrate cavity in the package substrate.

23. A package comprising:
an active die comprising a semiconductor substrate and an interconnect structure disposed on the semiconductor substrate, the active die comprising an active circuit;
a resonator die coupled to the active die, the resonator die comprising an acoustic wave resonator;
a package substrate, the package substrate electrically coupled to the active die, and to the resonator die; and
a die cavity in the active die, the cavity above the acoustic wave resonator of the resonator die, wherein the die cavity is disposed in the interconnect structure of the active die.

24. A package comprising:
an active die comprising an acoustic wave resonator;
a package substrate electrically coupled to the active die;
a seal frame surrounding the acoustic wave resonator and attached to the active die and to the package substrate, the seal frame hermetically sealing the acoustic wave resonator in a cavity between the active die and the package substrate, wherein the seal frame comprises a first metal layer on the active die and a second metal layer on the package substrate; and
a substrate cavity disposed in the package substrate beneath the acoustic wave resonator.

25. A package comprising:
an active die comprising an acoustic wave resonator;
a package substrate electrically coupled to the active die, wherein the package substrate comprises a passive device, wherein the passive device is electrically coupled to an electrode of the acoustic wave resonator, wherein the passive device is selected from the group consisting of a resistor, a capacitor, an inductor, and a transformer;
a seal frame surrounding the acoustic wave resonator and attached to the active die and to the package substrate, the seal frame hermetically sealing the acoustic wave resonator in a cavity between the active die and the package substrate; and
a substrate cavity disposed in the package substrate beneath the acoustic wave resonator.

26. A package comprising:
an active die comprising an acoustic wave resonator;
a package substrate electrically coupled to the active die, wherein the package substrate is a multilayer organic substrate;
a seal frame surrounding the acoustic wave resonator and attached to the active die and to the package substrate, the seal frame hermetically sealing the acoustic wave resonator in a cavity between the active die and the package substrate; and
a hermetic coating on a surface of the package substrate nearest the active die, wherein the hermetic coating is surrounded by the seal frame.

27. A package comprising:
an active die comprising an acoustic wave resonator;
a package substrate electrically coupled to the active die, wherein the package substrate is a multilayer organic substrate;
a seal frame surrounding the acoustic wave resonator and attached to the active die and to the package substrate, the seal frame hermetically sealing the acoustic wave resonator in a cavity between the active die and the package substrate; and
a cavity disposed in the package substrate on a side nearest the active die, wherein the cavity is lined with a hermetic coating.

28. A package comprising:
an active die comprising an acoustic wave resonator;
a package substrate electrically coupled to the active die, wherein the package substrate is a multilayer organic substrate, and wherein the package substrate comprises a plurality of metal layers, a plurality of dielectric layers, and a plurality of vias; and
a seal frame surrounding the acoustic wave resonator and attached to the active die and to the package substrate, the seal frame hermetically sealing the acoustic wave resonator in a cavity between the active die and the package substrate, wherein the cavity has a sidewall comprising one of the vias of the plurality of vias.

* * * * *